(12) United States Patent
Park et al.

(10) Patent No.: US 11,119,934 B2
(45) Date of Patent: Sep. 14, 2021

(54) STORAGE DEVICE HAVING ENHANCED MAP UPDATE SPEED AND METHOD THEREOF

(71) Applicant: SK hynix Inc., Gyeonggi-do (KR)

(72) Inventors: Byeong Gyu Park, Gyeonggi-do (KR); Sung Hun Jeon, Gyeonggi-do (KR); Young Ick Cho, Seoul (KR); Seung Gu Ji, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 157 days.

(21) Appl. No.: 16/567,449

(22) Filed: Sep. 11, 2019

(65) Prior Publication Data

US 2020/0201774 A1 Jun. 25, 2020

(30) Foreign Application Priority Data

Dec. 20, 2018 (KR) ........................ 10-2018-0166635

(51) Int. Cl.
*G06F 12/00* (2006.01)
*G06F 12/0873* (2016.01)
*G06F 12/02* (2006.01)
*G11C 11/56* (2006.01)
*G06F 9/38* (2018.01)

(52) U.S. Cl.
CPC ........ *G06F 12/0873* (2013.01); *G06F 9/3814* (2013.01); *G06F 12/0246* (2013.01); *G11C 11/5642* (2013.01); *G06F 2212/60* (2013.01); *G06F 2212/7201* (2013.01)

(58) Field of Classification Search
CPC ............ G06F 12/0873; G06F 12/0246; G06F 9/3814; G06F 2212/60; G06F 2212/7201; G11C 11/5642; G11C 16/0483; G11C 16/10

See application file for complete search history.

(56) References Cited

U.S. PATENT DOCUMENTS

2015/0019794 A1* 1/2015 Byun .................. G06F 12/0246
711/103

FOREIGN PATENT DOCUMENTS

KR 10-2016-0021957 2/2016
KR 10-2016-0114337 10/2016

* cited by examiner

*Primary Examiner* — Jason W Blust
(74) *Attorney, Agent, or Firm* — IP & T Group LLP

(57) ABSTRACT

Provided herein may be a storage device and a method of operating the storage device. The storage device includes a memory controller having a map manager and preload mapping information storage, and a memory device having logical-to-physical mapping information. The memory controller determines and obtains from the memory device, preloads mapping information, and then stores the preload mapping information in the preload mapping information storage, before a map update operation of the logical-to-physical mapping information is performed. The preload mapping information includes logical-to-physical mapping information to be updated.

20 Claims, 16 Drawing Sheets

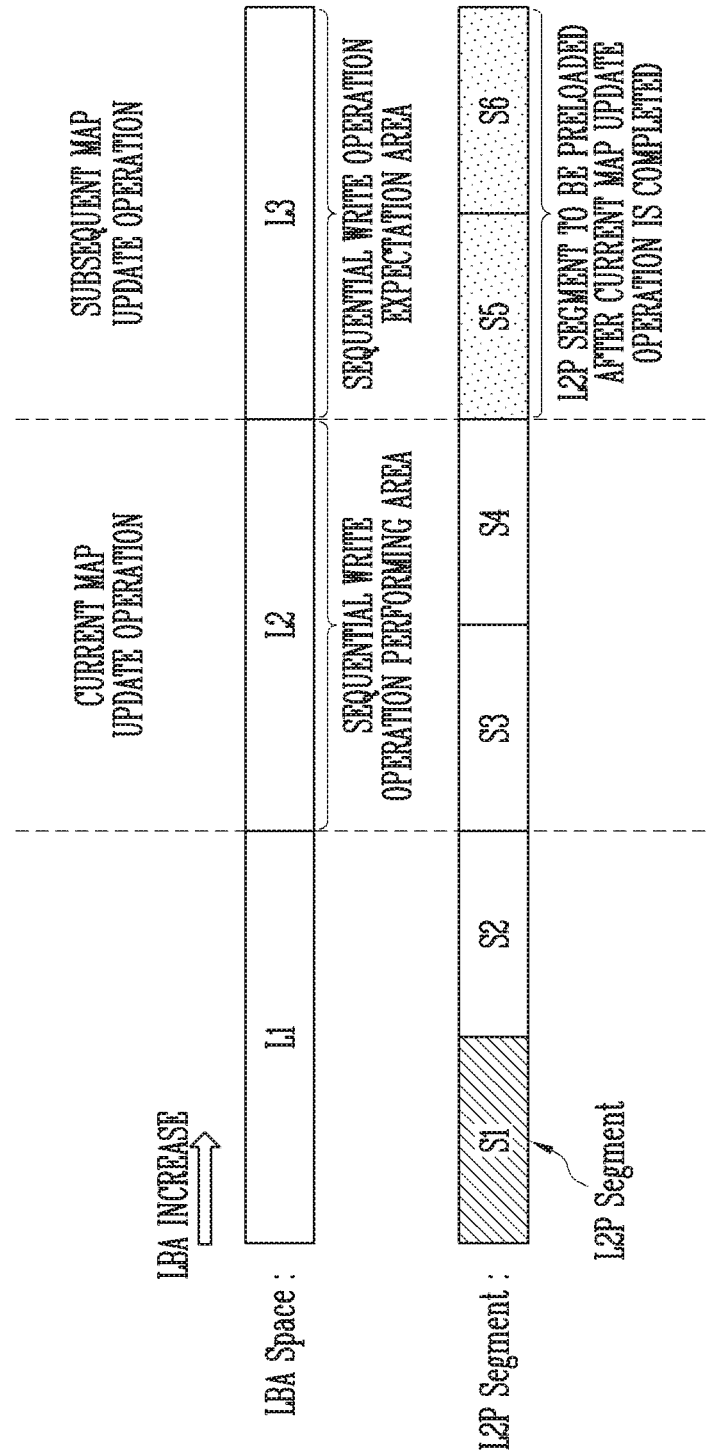

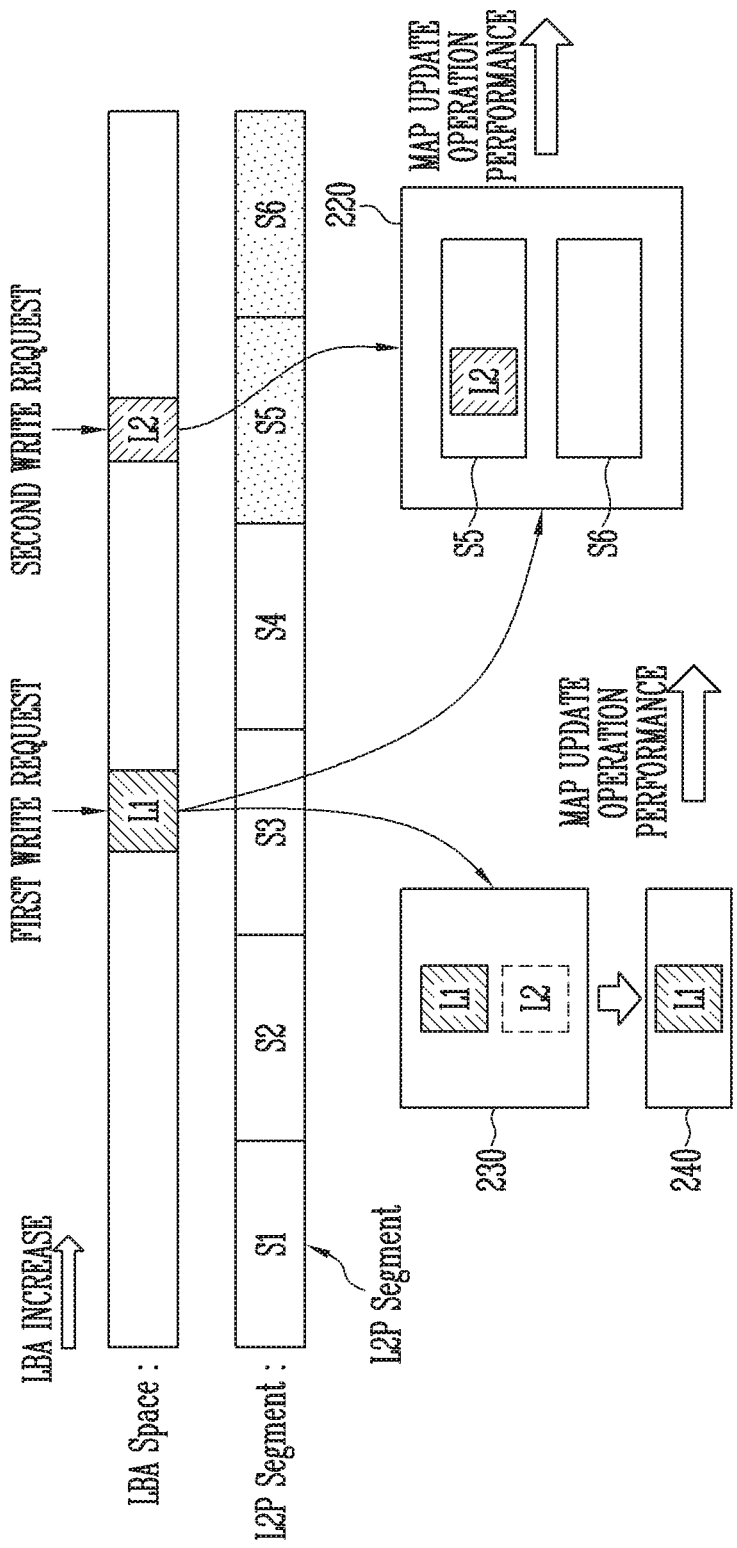

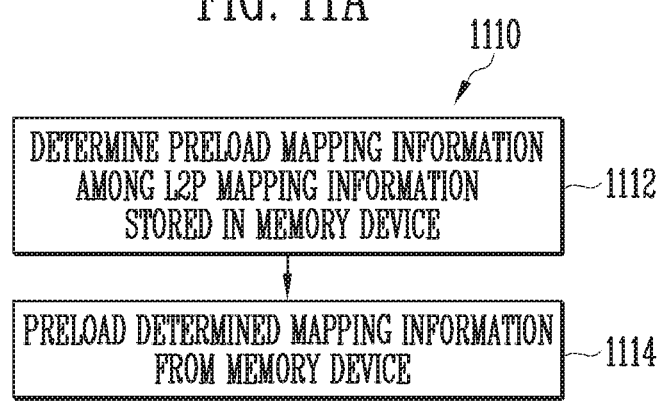
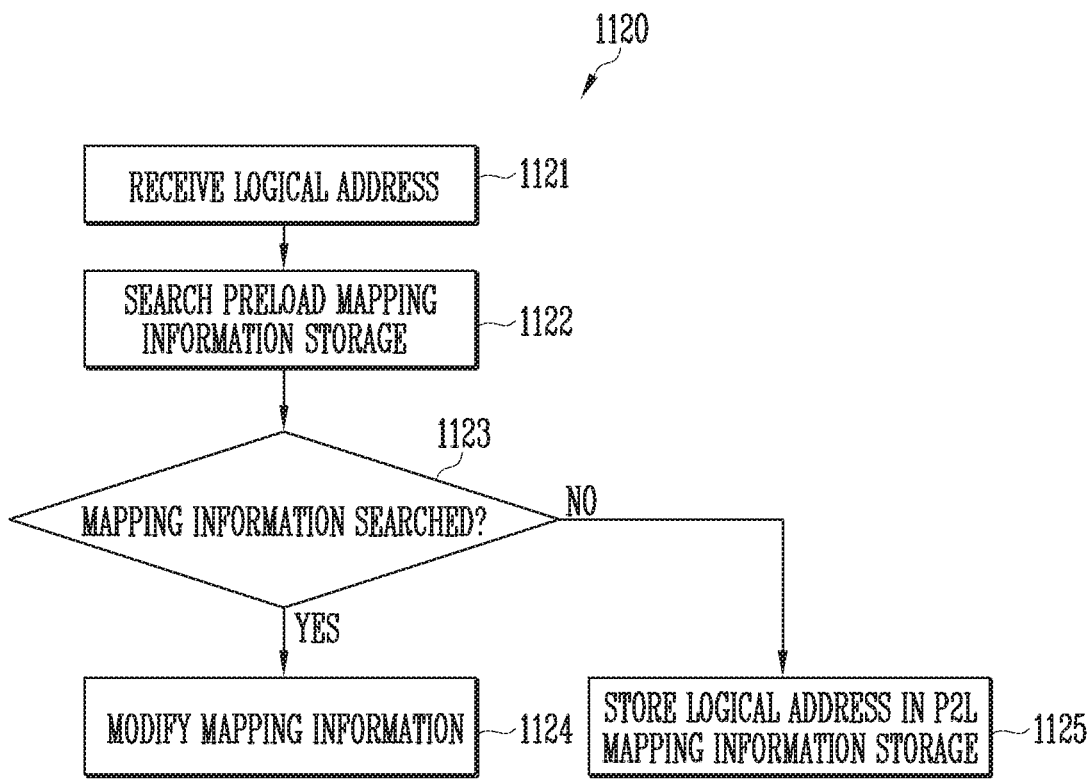

STORAGE DEVICE HAVING ENHANCED MAP UPDATE SPEED AND METHOD THEREOF

CROSS-REFERENCE TO RELATED APPLICATION

The present application claims priority under 35 U.S.C. § 119(a) to Korean patent application number 10-2018-0166635, filed on Dec. 20, 2018, which is incorporated by reference in its entirety.

BACKGROUND

Field of Invention

Various embodiments of the present disclosure generally relate to an electronic device, and more particularly, to a storage device and a method of operating the storage device.

Description of Related Art

Generally, a storage device stores data under control of a host device such as a computer or a smartphone. The storage device may include a memory device configured to store data, and a memory controller configured to control the memory device. Memory devices are chiefly classified into volatile memory devices and nonvolatile memory devices.

A volatile memory device is a memory device, in which stored data is lost when power is turned off. Examples of a volatile memory device include a static random access memory (SRAM), and a dynamic random access memory (DRAM).

A nonvolatile memory device is a memory device in which stored data is maintained even when power is turned off. Examples of a nonvolatile memory device include a read-only memory (ROM), a programmable ROM (PROM), an electrically programmable ROM (EPROM), an electrically erasable programmable ROM (EEPROM), and a flash memory.

In current technology, physical address information and logical address information pertaining to where data is stored in a memory device, are mapped to each other. Typically, when new data is written to the memory device or when existing data is removed from the memory device, a map update operation is required. However, since there are generally a significant number of logical addresses to update for a corresponding physical address, the map update operation can consume a considerable amount of time thereby impacting overall performance of the data storage device. Therefore, a data storage device having more efficient map update capabilities which reduce the amount of time required to perform a map update is desired.

SUMMARY

Various embodiments of the present disclosure are directed to a storage device capable of reducing a speed of a map update operation, and a method of operating the storage device.

In one aspect, a storage device includes a memory controller having a map manager and preload mapping information storage, and a memory device having logical-to-physical mapping information. The memory controller determines and obtains from the memory device, preload mapping information, and then stores the preload mapping information in the preload mapping information storage, before a map update operation of the logical-to-physical mapping information is performed. The preload mapping information includes logical-to-physical mapping information to be updated.

In another aspect, a storage device includes a memory device configured to store a plurality of logical-to-physical segments including mapping information between a logical address of data provided from a host and a physical address in which the data is stored, and a memory controller configured to determine, before a map update operation of updating the plurality of logical-to-physical segments is performed, at least one or more logical-to-physical segments to be updated, obtain the at least one or more logical-to-physical segments from the memory device, and store the at least one or more logical-to-physical segments in a preload mapping information storage.

In still another aspect, a storage device includes a memory device including an area suitable for storing multiple mapping information, and a controller including a map manager. The map manager updates first mapping information including a first logical address associated with the memory device, among the multiple mapping information, based on a first physical address corresponding to the first logical address; preloads, from the memory device, second mapping information among the multiple mapping information; and updates the second mapping information based on a second physical address corresponding to a second logical address associated with the memory device.

In still yet another aspect, a storage device includes a memory device including a block and an area suitable for storing multiple mapping information, and a controller including a mapping information storage and a map manager. The map manager preloads, from the memory device, first mapping information among the multiple mapping information to store the first mapping information in the mapping information storage; receives a first logical address mapped into a first physical address of the block; and when the first mapping information corresponds to the first logical address, modifies the stored first mapping information based on the first physical address.

In still another aspect, a method for operating a storage device includes: updating first mapping information including a first logical address associated with a memory device including an area for storing multiple mapping information, among the multiple mapping information, based on a first physical address corresponding to the first logical address; preloading, from the memory device, second mapping information among the multiple mapping information; and updating the second mapping information based on a second physical address corresponding to a second logical address associated with the memory device.

In still yet another aspect, a method for operating a storage device includes: preloading, from a memory device including a block and an area for storing multiple mapping information, first mapping information among the multiple mapping information; receiving a first logical address mapped into a first physical address of the block; and when the first mapping information corresponds to the first logical address, modifying the preloaded first mapping information based on the first physical address.

Additional aspects of the present invention will become apparent from the following description.

BRIEF DESCRIPTION OF THE DRAWINGS

FIG. 9A is a diagram illustrating an operation of determining preload mapping information in accordance with an embodiment of the present disclosure.

FIG. 10 is a diagram illustrating a map update operation in accordance with an embodiment of the present disclosure.

FIGS. 11A to 11C are flowcharts illustrating operations of a memory controller in accordance with an embodiment of the present disclosure.

DETAILED DESCRIPTION

Figure 1:
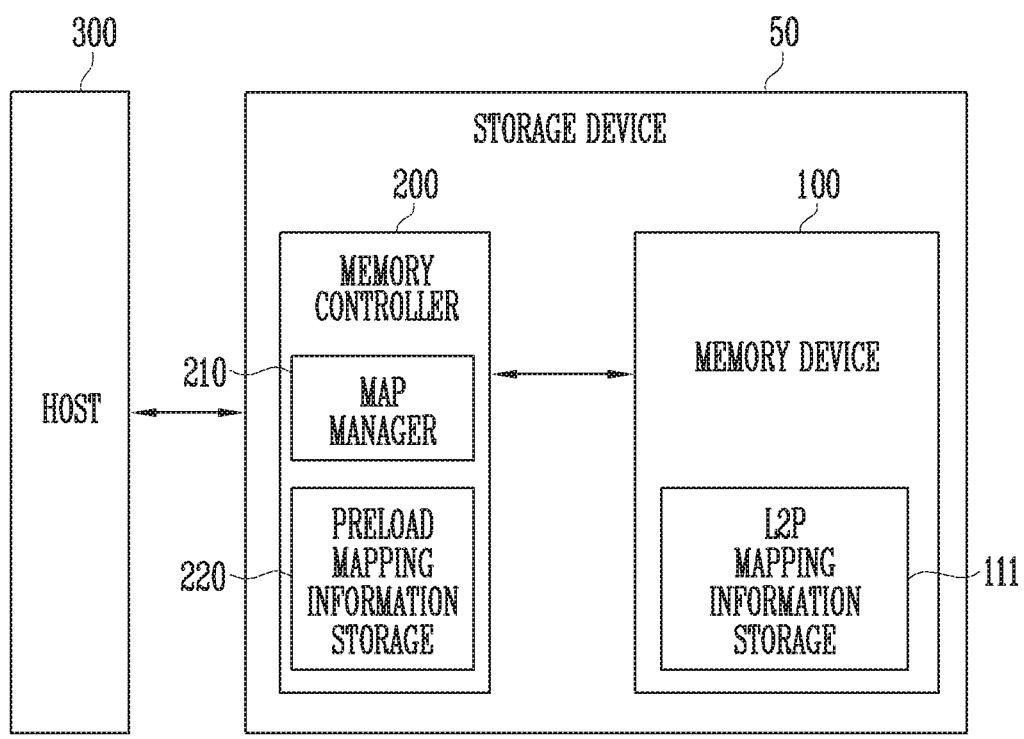
FIG. 1 is a diagram illustrating a storage device in accordance with an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will now be described in detail based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, it is to be understood that the present description is not intended to limit the present disclosure to those exemplary embodiments, and the present disclosure is intended to cover not only the exemplary embodiments, but also various alternatives, modifications, equivalents and other embodiments that fall within the spirit and scope of the present disclosure.

It will be understood that, although the terms "first", "second", etc. may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Hereinafter, the present disclosure will be described in detail by describing exemplary embodiments of the present disclosure with reference to the accompanying drawings.

FIG. 1 is a diagram illustrating a storage device 50 in accordance with an embodiment of the present disclosure.

Referring to FIG. 1, the storage device 50 may include a memory device 100, and a memory controller 200 configured to control the operation of the memory device 100. The storage device 50 may be a device configured to store data under control of a host 300. The host 300 may be a device such as a cellular phone, a smartphone, an MP3 player, a laptop computer, a desktop computer, a game machine, a television (TV), a tablet personal computer (PC), or an in-vehicle infotainment system.

The storage device 50 may be manufactured as any one of various types of storage devices depending on a host interface, which is a communication system with the host 300. For example, the data storage device 50 may be configured of any one of various types of storage devices such as a solid state drive (SSD), a multimedia card (MMC) (e.g., eMMC, RS-MMC, or micro-MMC), a secure digital (SD)(e.g., mini-SD, micro-SD), a universal serial bus (USB) storage device, a universal flash storage (UFS) device, a personal computer memory card international association (PCMCIA) card type storage device, a peripheral component interconnection (PCI) card type storage device, a PCI-express (PCI-e or PCIe) type storage device, a compact flash (CF) card, a smart media card, and a memory stick.

The storage device 50 may be manufactured in the form of any one of various package types. For instance, the storage device 50 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data therein. The memory device 100 may operate under control of the memory controller 200. The memory device 100 may include a memory cell array including a plurality of memory cells configured to store data therein.

The memory cells may include a single level cell (SLC) capable of storing a single bit of data, a multi-level cell (MLC) capable of storing two bits of data, a triple-level cell (TLC) capable of storing three bits of data, or a quad-level cell (QLC) capable of storing four bits of data.

The memory cell array may include a plurality of memory blocks. Each memory block may include a plurality of memory cells. Each memory block may include a plurality of pages. In an embodiment, each page may be the unit for storing data in the memory device 100 or reading stored data from the memory device 100. Each memory block may be the unit of erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change random access memory (PRAM), a magnetoresistive random access memory (MRAM), a ferroelectric random access memory (FRAM), or a spin transfer torque random access memory (STT-RAM). In this specification, by way of example, the memory device 100 is a NAND flash memory.

The memory device 100 may receive a command and an address from the memory controller 200, and access an area of the memory cell array that is selected by the address. That is, the memory device 100 may perform an operation corresponding to the command on the area selected by the address. For example, the memory device 100 may perform a write (or program) operation, a read operation, and an erase operation. During a program operation, the memory device 100 may program data to an area selected by an address. During a read operation, the memory device 100 may read data from an area selected by an address. During an erase operation, the memory device 100 may erase data from an area selected by an address.

In an embodiment, the memory device 100 may include logical-to-physical (L2P) mapping information storage 111.

The logical-to-physical mapping information storage 111 may store logical-to-physical (L2P) mapping information between logical addresses and physical addresses. For example, the logical-to-physical mapping information may indicate a mapping relationship between a logical address of data provided from the host 300 and a physical address of the memory device 100 in which the data is stored.

In an embodiment, the logical-to-physical mapping information storage 111 may be formed in a spare area of each of the plurality of memory blocks in the memory cell array. In an embodiment, the logical-to-physical mapping information storage 111 may be formed of at least one system block, which stores system information, among the plurality of memory blocks in the memory cell array. In an embodiment, the logical-to-physical mapping information storage 111 may be formed of word lines disposed at specific positions among word lines, which are included in the plurality of memory blocks in the memory cell array.

The memory controller 200 may control overall operations of the storage device 50.

When power is applied to the storage device 50, the memory controller 200 may execute firmware. In the case where the memory device 100 is a flash memory device, the memory controller 200 may execute firmware such as a flash translation layer (FTL) for controlling communication between the host 300 and the memory device 100.

In an embodiment, the memory controller 200 may receive data and a logical block address (LBA) from the host 300, and translate the LBA into a physical block address (PBA) indicating addresses of memory cells included in the memory device 100 in which data is stored.

The memory controller 200 may control the memory device 100 to perform a program operation, a read operation, or an erase operation in response to a request from the host 300. During the program operation, the memory controller 200 may provide a program command, a PBA, and data to the memory device 100. During the read operation, the memory controller 200 may provide a read command and a PBA to the memory device 100. During the erase operation, the memory controller 200 may provide an erase command and a PBA to the memory device 100.

In an embodiment, the memory controller 200 may autonomously generate a program command, an address and data regardless of a request from the host 300, and transmit the program command, the address and data to the memory device 100. For example, the memory controller 200 may provide a command, an address and data to the memory device 100 to perform background operations such as a wear leveling operation, and a garbage collection operation.

In an embodiment, the memory controller 200 may control at least two or more memory devices 100, In this case, the memory controller 200 may control the memory devices 100 in an interleaving manner to enhance the operating performance. The interleaving scheme may be an operating scheme of overlapping operating periods of at least two or more memory devices 100.

In an embodiment, the memory controller 200 may include a map manager 210 and a preload mapping information storage 220.

The map manager 210 may perform a map update operation of updating the logical-to-physical mapping information stored in the memory device 100.

In various embodiments, the map update operation may include an operation of loading some of the logical-to-physical mapping information stored in the memory device 100 on the memory controller 200. The map update operation may include an operation of modifying the loaded logical-to-physical mapping information based on logical addresses corresponding to write data provided from the host 300. The write data may be data to be stored in the memory device 100 in response to a write request of the host 300. The map update operation may include an operation of updating the stored logical-to-physical mapping information stored in the memory device 100, based on the modified logical-to-physical mapping information. In detail, the map update operation may include an operation of writing the modified logical-to-physical mapping information to the memory device 100. Here, existing logical-to-physical mapping information corresponding to the modified logical-to-physical mapping information written to the memory device 100 may be invalidated.

In an embodiment, when the map update operation is performed, the map manager 210 may load some of the logical-to-physical mapping information stored in the memory device 100.

In an embodiment, the map manager 210 may determine preload mapping information expected to be updated among the logical-to-physical mapping information stored in the memory device 100. The map manager 210 may bad the determined preload mapping information before a subsequent map update operation is performed. The map manager 210 may obtain the preload mapping information from the memory device 100.

The map manager 210 may provide, to the memory device 100, a command for preloading the preload mapping information stored in the memory device 100. The map manager 210 may receive the preload mapping information from the memory device 100 in response to the command.

The map manager 210 may receive a write request from the host 300. The map manager 210 may receive write data and logical addresses corresponding to the write data in response to the write request from the host 300. The map manager 210 may modify, using the logical addresses corresponding to the write data, the preload mapping information stored in the preload mapping information storage 220.

The map manager 210 may update the logical-to-physical mapping information stored in the memory device 100, based on the modified preload mapping information. The map manager 210 may provide, to the memory device 100, a program command for storing the modified preload mapping information in the memory device 100. If the modified preload mapping information is stored in the memory device 100, existing logical-to-physical mapping information corresponding to the modified preload mapping information stored in the memory device 100 may be invalidated.

The preload mapping information storage 220 may store the preload mapping information loaded by the map manager 210.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
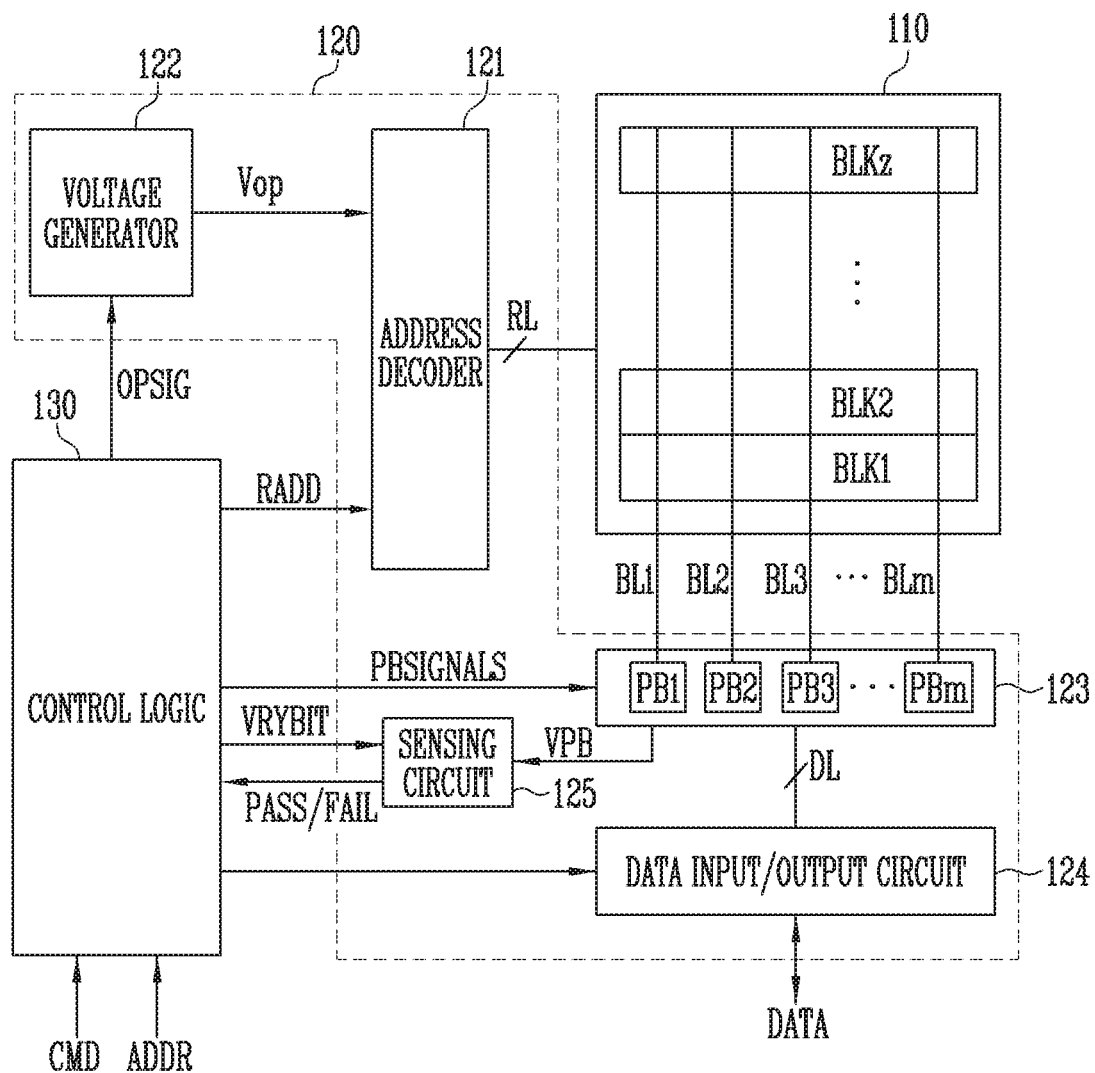
FIG. 2 is a diagram illustrating a memory device in accordance with an embodiment of the present disclosure.

FIG. 2 is a diagram illustrating a memory device in accordance with an embodiment of the present disclosure, for example, the memory device 100 of FIG. 1.

Referring to FIG. 2, the memory device 100 may include a memory cell array 110, a peripheral circuit 120, and a control logic 130.

The peripheral circuit 120 may include an address decoder 121, a voltage generator 122, a read and write (read/write) circuit 123, a data input and output (input/output) circuit 124, and a sensing circuit 125.

The memory cell array 110 may include a plurality of memory blocks BLK1 to BLKz. The plurality of memory blocks BLK1 to BLKz are coupled to the address decoder 121 through row lines RL. The memory blocks BLK1 to BLKz may be coupled to the read/write circuit 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line among the plurality of memory cells are defined as one page. That is, the memory cell array 110 may be formed of a plurality of physical pages. In an embodiment, each of the memory blocks BLK1 to BLKz in the memory cell array 110 may include a plurality of dummy cells. One or more dummy cells may be coupled in series between a drain select transistor and the memory cells, and between a source select transistor and the memory cells.

Each of the memory cells of the memory device 100 may be formed of a single level cell (SLC) capable of storing a single bit of data, a multi-level cell (MLC) capable of storing two bits of data, a triple-level cell (TLC) capable of storing three bits of data, or a quad-level cell (QLC) capable of storing four bits of data.

In an embodiment, the memory cell array 110 may include logical-to-physical mapping information storage (e.g., the logical-to-physical mapping information storage 111 of FIG. 1).

The logical-to-physical mapping information storage may store logical-to-physical mapping information. The logical-to-physical mapping information may indicate a mapping relationship between logical addresses of data provided from the host described with reference to FIG. 1 and physical addresses of the memory cell array 110 in which the data is stored.

In an embodiment, the logical-to-physical mapping information storage may be formed of a spare area in each of the plurality of memory blocks in the memory cell array 110. In an embodiment, the logical-to-physical mapping information storage may be formed of at least one system block which stores system information in the memory cell array 110. In an embodiment, the logical-to-physical mapping information storage may be formed of word lines disposed at specific positions among word lines, which are included in the plurality of memory blocks in the memory cell array 110.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may operate under control of the control logic 130. The address decoder 121 may receive addresses ADDR from the control logic 130.

The address decoder 121 may decode a block address among the received addresses ADDR. The address decoder 121 may select at least one of the memory blocks BLK1 to BLKz according to the decoded block address. The address decoder 121 may decode a row address RADD among the received addresses ADDR. The address decoder 121 may select at least one word line WL of the selected memory block by applying voltages supplied from the voltage generator 122 to at least one word line WL according to the decoded row address RADD.

During a program operation, the address decoder 121 may apply a program voltage to a selected word line and apply a pass voltage having a level less than that of the program voltage to unselected word lines. During a program verify operation, the address decoder 121 may apply a verify voltage to a selected word line and apply a verify pass voltage having a level greater than that of the verify voltage to unselected word lines.

During a read operation, the address decoder 121 may apply a read voltage to a selected word line and apply a read pass voltage having a level greater than that of the read voltage to unselected word lines.

In an embodiment, an erase operation of the memory device 100 may be performed on a memory block basis. During the erase operation, an address ADDR to be input to the memory device 100 includes a block address. The address decoder 121 may decode the block address and select a corresponding memory block according to the decoded block address. During the erase operation, the address decoder 121 may apply a ground voltage to word lines coupled to the selected memory block.

In an embodiment of the present disclosure, the address decoder 121 may decode a column address among the transmitted addresses ADDR. The decoded column address may be transmitted to the read/write circuit 123. For example, the address decoder 121 may include components such as a row decoder, a column decoder, and an address buffer.

The voltage generator 122 may generate a plurality of operating voltages Vop using an external supply voltage supplied to the memory device 100. The voltage generator 122 may operate under control of the control logic 130.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of operating voltages Vop using an external supply voltage or an internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include, so as to generate a plurality of operating voltages Vop having various voltage levels, a plurality of pumping capacitors configured to receive an internal supply voltage. Further, the voltage generator 122 may generate a plurality of operating voltages Vop by selectively enabling the plurality of pumping capacitors under control of the control logic 130.

The generated operating voltages Vop may be supplied to the memory cell array 110 by the address decoder 121.

The read/write circuit 123 may include first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may operate under control of the control logic 130.

The first to m-th page buffers PB1 to PBm may communicate data DATA with the data input/output circuit 124. During a program operation, the first to m-th page buffers PB1 to PBm may receive data DATA to be stored through the data input/output circuit 124 and data lines DL.

During a program operation, the first to m-th page buffers PB1 to PBm may transmit the data DATA, received through the data input/output circuit 124, to selected memory cells through the bit lines BL1 to BLm when a program pulse is applied to a selected word line. The memory cells in the selected page are programmed based on the transmitted data DATA. Memory cells coupled to a bit line to which a program enable voltage (e.g. a ground voltage) is applied may have increased threshold voltages. Threshold voltages of memory cells coupled to a bit line to which a program inhibit voltage (for example, a supply voltage) is applied may be retained. During a program verify operation, the first to m-th page buffers PB1 to PBm may read data DATA from selected memory cells through the bit lines BL1 to BLm.

During a read operation, the read/write circuit 123 may read data DATA from the memory cells of the selected page through the bit lines BL, and store the read data DATA to the first to m-th page buffers PB1 to PBm.

During an erase operation, the read/write circuit 123 may float the bit lines BL. In an embodiment, the read/write circuit 123 may include a column select circuit.

In an embodiment, while data stored in some page buffers of the plurality of page buffers in the read/write circuit 123 is programmed to the memory cell array 110, the other page buffers may receive new data from the memory controller 200 and store the new data.

The data input/output circuit 124 is coupled to the first to m-th page buffers PB1 to PBm through the data lines DL. The data input/output circuit 124 may operate under control of the control logic 130.

The data input/output circuit 124 may include a plurality of input/output buffers (not shown) for receiving inputted data DATA. During a program operation, the data input/output circuit 124 may receive data DATA to be stored from an external controller (e.g., the memory controller 200 of FIG. 1). During a read operation, the data input/output circuit 124 may output, to the external controller, the data DATA received from the first to m-th page buffers PB1 to PBm in the read/write circuit 123.

During a read operation or a verify operation, the sensing circuit 125 may generate reference current in response to an enable bit signal VRYBIT generated by the control logic 130. Further, the sensing circuit 125 may compare a sensing voltage VPB received from the read/write circuit 123 with a reference voltage generated by the reference current, and output a pass signal or a fail signal to the control logic 130.

The control logic 130 may be coupled to the address decoder 121, the voltage generator 122, the read/write circuit 123, the data input/output circuit 124, and the sensing circuit 125. The control logic 130 may control the overall operation of the memory device 100. The control logic 130 may operate in response to a command CMD received from an external device (e.g., the memory controller 200 of FIG. 1).

The control circuit 130 may generate various signals in response to the command CMD and the address ADD, and control the peripheral circuit 120. For example, the control logic 130 may generate an operating signal OPSIG, a row address RADD, a read/write circuit control signal PBSIGNALS, and an enable bit VRYBIT in response to the command CMD and the address ADD. The control logic 130 may output the operating signal OPSIG to the voltage generator 122, output the row address RADD to the address decoder 121, output the read/write circuit control signal PBSIGNALS to the read/write circuit 123, and output the enable bit VRYBIT to the sensing circuit 125. Furthermore, the control logic 130 may determine whether target memory cells have passed or failed a verification during the verify operation in response to a pass signal PASS or a fail signal FAIL that is output from the sensing circuit 125.

Figure 3:
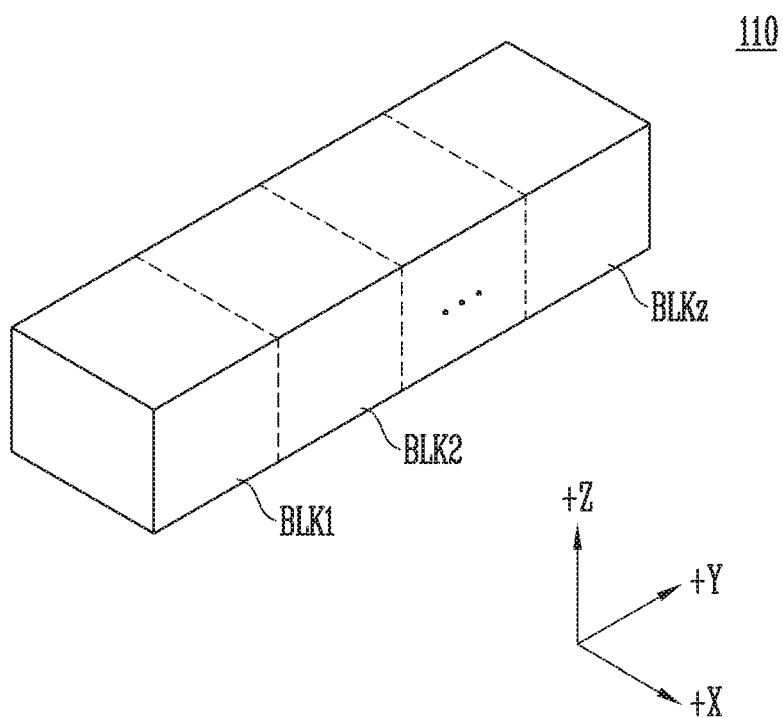
FIG. 3 is a diagram illustrating a memory cell array in accordance with an embodiment of the present disclosure.

FIG. 3 is a diagram illustrating a memory cell array in accordance with an embodiment of the present disclosure, for example, the memory cell array 110 of FIG. 2.

Referring to FIG. 3, the memory cell array 110 may include a plurality of memory blocks BLK1 to BLKz. Each memory block has a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 4 and 5.

Figure 4:
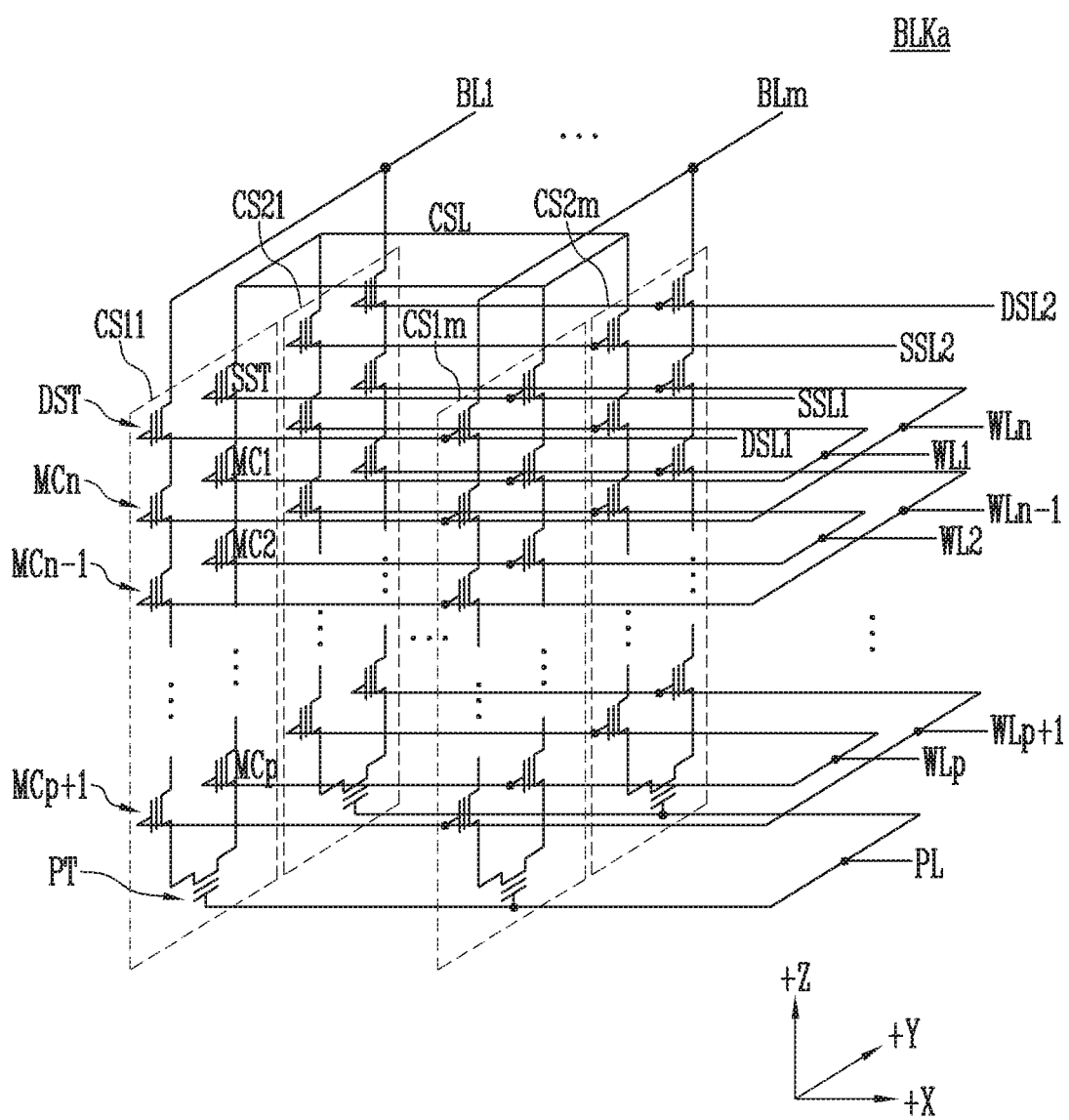
FIG. 4 is a circuit diagram illustrating a memory block in accordance with an embodiment of the present disclosure.

FIG. 4 is a circuit diagram illustrating a memory block in accordance with an embodiment of the present disclosure, for example, a memory block BLKa of memory blocks BLK1 to BLKz of FIG. 3.

Referring to FIG. 4, the memory block BLKa may include a plurality of cell strings CS11 to CS1$m$ and CS21 to CS2$m$. In an embodiment, each of the cell strings CS11 to CS1$m$ and CS21 to CS2$m$ may be formed in a shape. In the memory block BLKa, m cell strings may be arranged in a row direction (i.e., the +X direction). Two cell strings are illustrated as being arranged in a column direction (i.e., the +Y direction), however, three or more cell strings may be arranged in the column direction.

Each of the plurality of cell strings CS11 to CS1$m$ and CS21 to CS2$m$ may include at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 4, source select transistors of the cell strings CS11 to CS1$m$ in a first row are coupled to a first source select line SSL1. Source select transistors of the cell strings CS21 to CS2$m$ in a second row are coupled to a second source select line SSL2.

In an embodiment, the source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are successively arranged in a direction opposite to the +Z direction and are coupled in series between the source select transistor SST and the pipe transistor PT. The (p+1)-th to n-th memory cells MCp+1 to MCn are successively arranged in the +Z direction and are coupled in series between the pipe transistor PT and the drain select transistor DST. The first to p-th memory cells MC1 to MCp and the (p+1)-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. Drain select transistors of the cell strings arranged in the row direction are coupled to drain select lines extending in the row direction. Drain select transistors of the cell strings CS11 to CS1$m$ in the first row are coupled to a first drain select line DSL1. Drain select transistors of the cell strings CS21 to CS2$m$ in the second row are coupled to a second drain select line DSL2.

Cell strings arranged in the column direction may be coupled to bit lines extending in the column direction. In FIG. 4, cell strings CS11 and CS21 in a first column are coupled to a first bit line BL1. Cell strings CS1$m$ and CS2$m$ in an m-th column are coupled to an m-th bit line BLm.

Memory cells coupled to the same word line in cell strings arranged in the row direction form a single page. For example, memory cells coupled to the first word line WL1, among the cell strings CS11 to CS1$m$ in the first row, form a single page. Memory cells coupled to the first word line WL1, among the cell strings CS21 to CS2$m$ in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-numbered cell strings of the cell strings CS11 to CS1$m$ or CS21 to CS2$m$ arranged in the row direction may be coupled to the respective even bit lines. Odd-numbered cell strings of the cell strings CS11 to CS1$m$ or CS21 to CS2$m$ arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCp. Alternatively, at least one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the at least one or more dummy memory cells, each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 5:
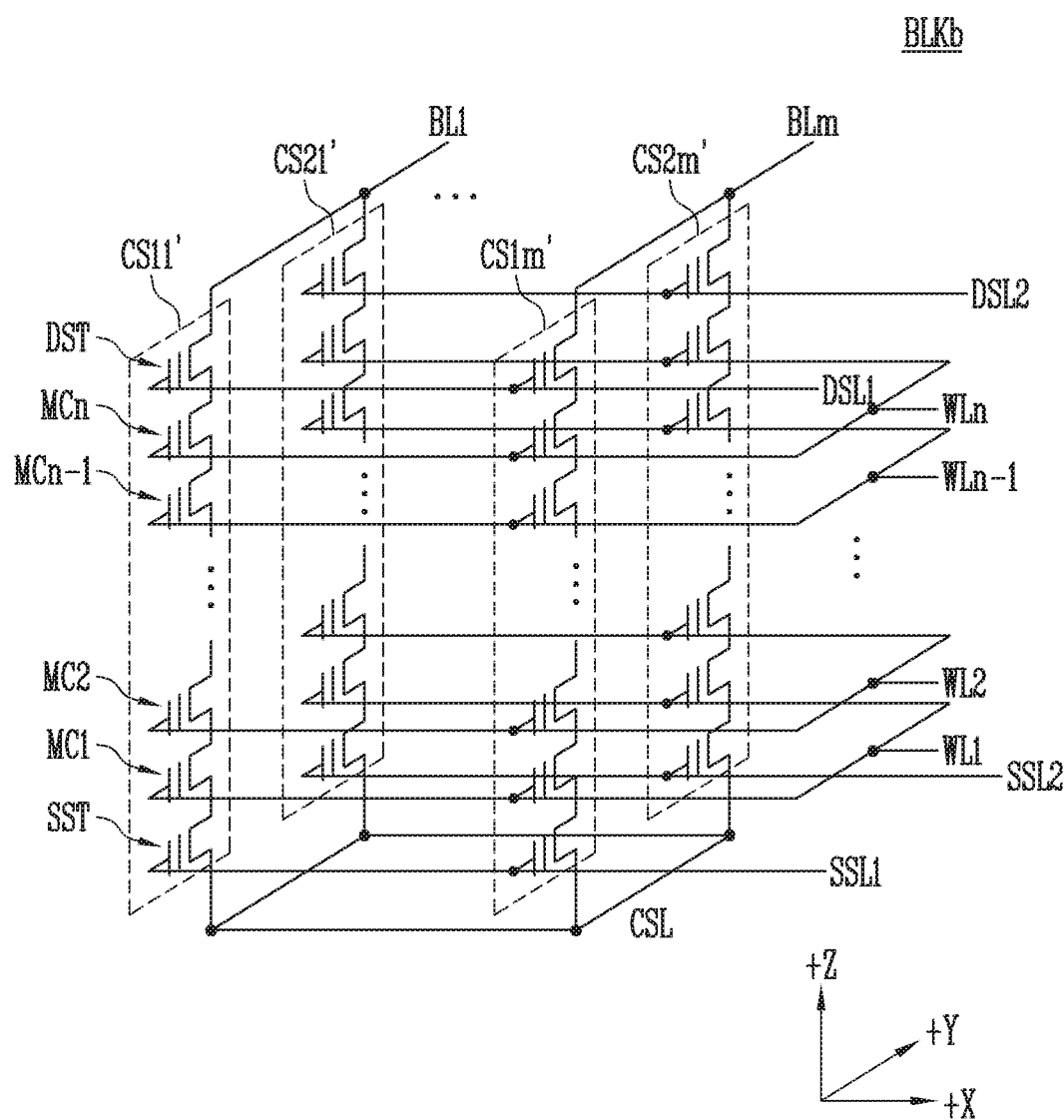
FIG. 5 is a circuit diagram illustrating a memory block in accordance with an embodiment of the present disclosure.

FIG. 5 is a circuit diagram illustrating a memory block in accordance with an embodiment of the present disclosure, for example, a memory block BLKb of memory blocks BLK1 to BLKz of FIG. 3.

Referring to FIG. 5, the memory block BLKb may include a plurality of cell strings CS11' to CS1$m$' and CS21' to CS2$m$'. Each of the cell strings CS11' to CS1$m$' and CS21' to CS2$m$' extends in the +Z direction. Each of the cell strings CS11' to CS1$m$' and CS21' to CS2$m$' may include at least one source select transistor SST, first to n-th memory cells MC1 to MCn, and at least one drain select transistor DST which are stacked on a substrate (not shown) provided in a lower portion of the memory block BLKb.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1$m$' arranged in a first row may be coupled to a first source select line SSL1. Source select transistors of the cell strings CS21' to CS2$m$' arranged in a second row may be coupled to a second source select line SSL2. In an embodiment, source select transistors of the cell strings CS11' to CS1$m$' and CS21' to CS2$m$' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1$m$' in the first row are coupled to a first drain select line DSL1. Drain select transistors of the cell strings CS21' to CS2$m$' in the second row may be coupled to a second drain select line DSL2.

Consequentially, the memory block BLKb of FIG. 5 may have an equivalent circuit similar to that of the memory block BLKa of FIG. 4 except that a pipe transistor PT is excluded from each cell string.

In an embodiment, even bit lines and odd bit lines may be provided in lieu of the first to m-th bit lines BL1 to BLm. Even-numbered cell strings among the cell strings CS11' to CS1$m$' or CS21' to CS2$m$' arranged in the row direction may be coupled to the respective even bit lines. Odd-numbered cell strings among the cell strings CS11' to CS1$m$' or CS21' to CS2$m$' arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the at least one or more dummy memory cells, each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 6:
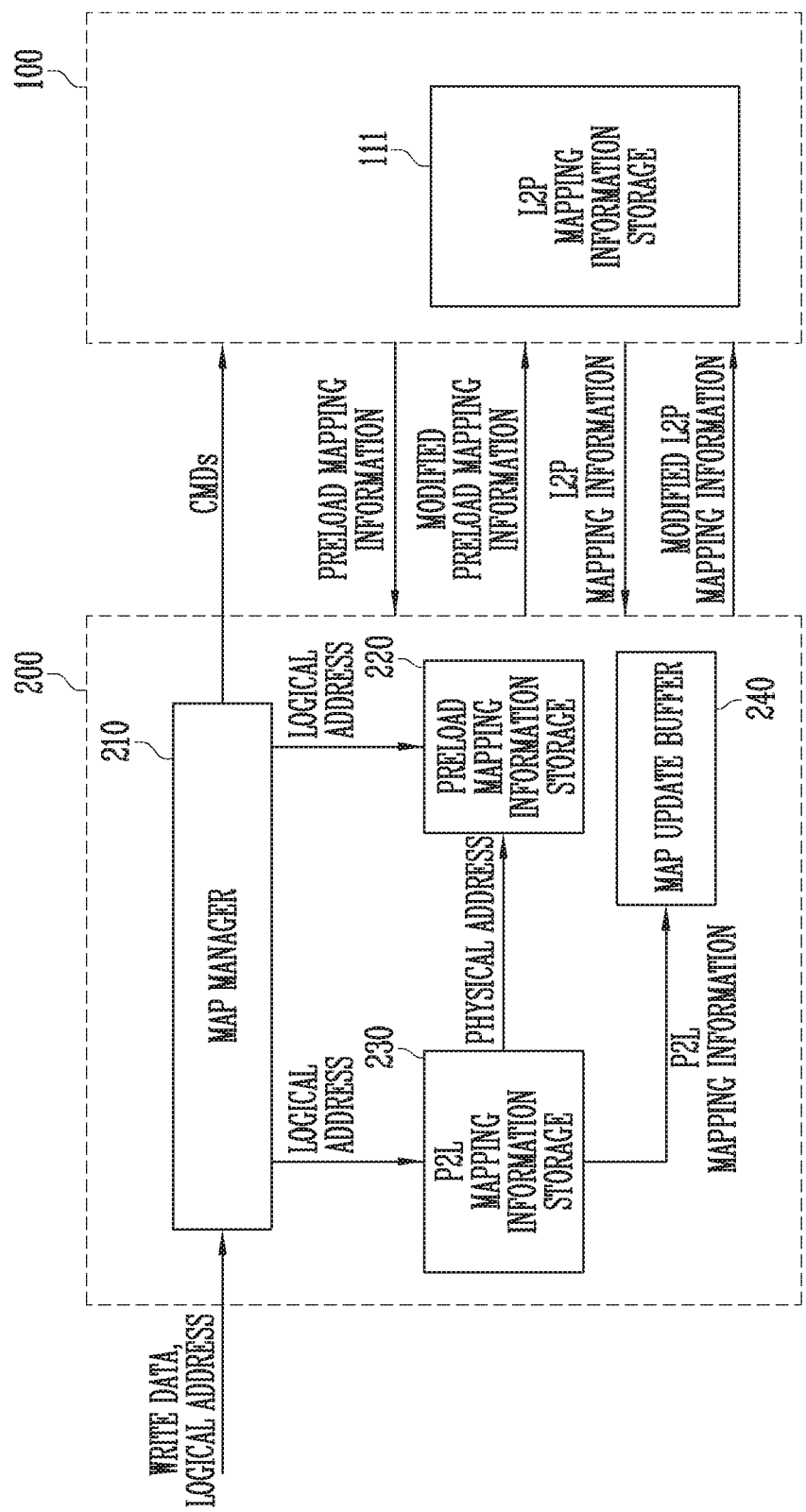
FIG. 6 is a diagram illustrating a memory controller in accordance with an embodiment of the present disclosure.

FIG. 6 is a diagram illustrating a memory controller in accordance with an embodiment of the present disclosure, for example, the memory controller 200. The memory controller 200 may be coupled to a memory device, for example, the memory device 100.

Referring to FIG. 6, the memory device 100 may include logical-to-physical (L2P) mapping information storage 111. The logical-to-physical mapping information storage 111 may store logical-to-physical (L2P) mapping information. The logical-to-physical mapping information may indicate a mapping relationship between logical addresses of data provided from a host (e.g., the host 300 of FIG. 1) and physical addresses of the memory device 100 in which the data is stored.

The logical-to-physical mapping information stored in the logical-to-physical mapping information storage 111 may include a plurality of logical-to-physical (L2P) segments. Each logical-to-physical segment may include logical addresses of a plurality of pieces of data, and physical addresses corresponding to the respective logical addresses.

The memory controller 200 may include a map manager 210, a preload mapping information storage 220, a physical-to-logical mapping information storage 230, and a map update buffer 240.

The map manager 210 may perform a map update operation of updating the logical-to-physical mapping information stored in the logical-to-physical mapping information storage 111.

The map update operation may include an operation of loading some of the logical-to-physical mapping information stored in the logical-to-physical mapping information storage 111 into the memory controller 200. The map update operation may include an operation of modifying the loaded logical-to-physical mapping information based on logical addresses corresponding to write data provided from the host 300. The write data may be data to be stored in at least one memory block of the memory device 100 in response to a write request of the host 300. The map update operation may include an operation of updating the logical-to-physical mapping information stored in the logical-to-physical mapping information storage 111, based on the modified logical-to-physical mapping information. The map update operation may include an operation of writing the modified logical-to-physical mapping information to the logical-to-physical mapping information storage 111. Here, existing logical-to-physical mapping information corresponding to the modified logical-to-physical mapping information written to the logical-to-physical mapping information storage 111 stored in the logical-to-physical mapping information storage 111 may be invalidated.

In an embodiment, the map manager 210 may determine some of the logical-to-physical mapping information stored in the logical-to-physical mapping information storage 111 to be preload mapping information. The preload mapping information may be logical-to-physical mapping information expected to be updated.

The preload mapping information may include at least one or more logical-to-physical segments of a plurality of logical-to-physical segments, which is included in the logical-to-physical mapping information stored in the logical-to-physical mapping information storage 111.

In an embodiment, the preload mapping information may include a logical-to-physical segment that is expected for a sequential write operation to be performed thereon. The at least one or more logical-to-physical segments may include a logical-to-physical segment which is sequential to a logical-to-physical segment on which a map update operation is currently performed.

In an embodiment, the preload mapping information may include a logical-to-physical segment that is expected for a random write operation to be performed thereon. Logical-to-physical segments including logical addresses on which the random write operation is to be performed may not be sequential to each other.

The map manager 210 may load the determined preload mapping information before a subsequent map update operation is performed.

The map manager 210 may provide, to the logical-to-physical mapping information storage 111, a command for loading the preload mapping information stored in the logical-to-physical mapping information storage 111. The map manager 210 may receive the preload mapping information from the logical-to-physical mapping information storage 111 in response to the command.

The map manager 210 may receive a write request from the host 300. The map manager 210 may receive write data and logical addresses corresponding to the write data in response to the write request from the host 300. The map manager 210 may modify, using the logical addresses corresponding to the write data, the preload mapping information in the preload mapping information storage 220. The map manager 210 may modify a logical-to-physical segment including the logical addresses corresponding to the received write data in the preload mapping information. The map manager 210 may change or add physical addresses, which correspond to the logical addresses of the write data in the logical-to-physical segment to be modified. Here, the physical addresses to be changed or added may be physical addresses in which the write data will be stored. The physical addresses in which the write data will be stored may be obtained from the physical-to-logical mapping information storage 230.

The map manager 210 may modify at least one or more logical-to-physical segments included in the preload mapping information while a program operation of storing the write data in the memory device 100 is performed.

The map manager 210 may update, based on the modified logical-to-physical segment, an existing logical-to-physical segment corresponding to the modified logical-to-physical segment stored in the logical-to-physical mapping information storage 111.

In detail, the map manager 210 may provide, to the memory device 100, a program command to store the modified logical-to-physical segment in the logical-to-physical mapping information storage 111. If the modified logical-to-physical segment is stored in the logical-to-physical mapping information storage 111, the existing logical-to-physical segment corresponding to the modified logical-to-physical segment stored in the logical-to-physical mapping information storage 111 may be invalidated.

In an embodiment, the map manager 210 may perform an operation of unmapping logical addresses included in any one logical-to-physical segment among the at least one or more logical-to-physical segments included in the preload mapping information. The map manager 210 may perform an unmapping operation while a program operation of storing the write data in the memory device 100 is performed.

The unmapping operation may be an operation of erasing a physical address mapped with a logical address to be unmapped included in the logical-to-physical mapping information. Alternatively, the unmapping operation may be an operation of modifying, using unmap data, a physical address mapped with a logical address to be unmapped included in the logical-to-physical mapping information.

The map manager 210 may store, in the physical-to-logical mapping information storage 230, physical-to-logical mapping information that is a mapping relationship between physical addresses of a storage area of a memory block in which write data is to be stored and logical addresses corresponding to the write data. The map manager 210 may provide, to the physical-to-logical mapping information storage 230, the logical addresses corresponding to the write data, which corresponds to the physical addresses of the storage area of the memory block in which the write data is to be stored. In an embodiment, the configurations and sizes of the physical-to-logical mapping information and the logical-to-physical mapping information may differ from each other.

In an embodiment, if the logical addresses of the write data are included in at least one or more logical-to-physical segments included in the preload mapping information, the map manager 210 may not store the physical-to-logical mapping information corresponding to the logical addresses of the write data in the physical-to-logical mapping information storage 230.

If the memory block in which the write data is stored becomes a write complete block to which data has been fully written, the map manager 210 may perform a map update operation. If all physical addresses corresponding to the memory block in which the write data is to be stored are allocated for data storage, the map manager 210 may perform the map update operation.

During the map update operation, the map manager 210 may load logical-to-physical mapping information to be updated in the logical-to-physical mapping information storage 111. The logical-to-physical mapping information to be updated may be logical-to-physical mapping information to be modified according to the physical-to-logical mapping information stored in the physical-to-logical mapping information storage 230.

The map manager 210 may store the loaded logical-to-physical mapping information in the map update buffer 240.

The preload mapping information storage 220 may store the preload mapping information loaded by the map manager 210.

The physical-to-logical mapping information storage 230 may store physical-to-logical mapping information. The physical-to-logical mapping information may be information indicating a mapping relationship between physical addresses corresponding to a storage area of a memory block in which write data is to be stored and logical addresses corresponding to the write data. A data write operation may be directly performed by the physical-to-logical mapping information storage 230 even without referring to the logical-to-physical mapping information storage 111 of the memory device 100. Therefore, the speed of the data write operation may be improved.

The map update buffer 240 may store logical-to-physical mapping information to be updated during a map update operation. The logical-to-physical mapping information to be updated may be logical-to-physical mapping information to be modified according to the physical-to-logical mapping information stored in the physical-to-logical mapping information storage 230.

In an embodiment, the logical-to-physical mapping information that is stored in the map update buffer 240 and is to be updated may be modified according to the physical-to-logical mapping information stored in the physical-to-logical mapping information storage 230. In another embodiment, logical-to-physical mapping information corresponding to the preload mapping information that is stored in the map update buffer 240 and is to be updated may not be modified according to the physical-to-logical mapping information stored in the physical-to-logical mapping information storage 230.

In an embodiment, the logical-to-physical mapping information stored in the logical-to-physical mapping information storage 111 may be updated according to the modified logical-to-physical mapping information that is stored in the map update buffer 240. In an embodiment, the logical-to-physical mapping information corresponding to the preload mapping information stored in the map update buffer 240 may not be used to update the logical-to-physical mapping information stored in the logical-to-physical mapping information storage 111. The reason for this is because the logical-to-physical mapping information stored in the logical-to-physical mapping information storage 111 is already updated according to the preload mapping information.

Figure 7:
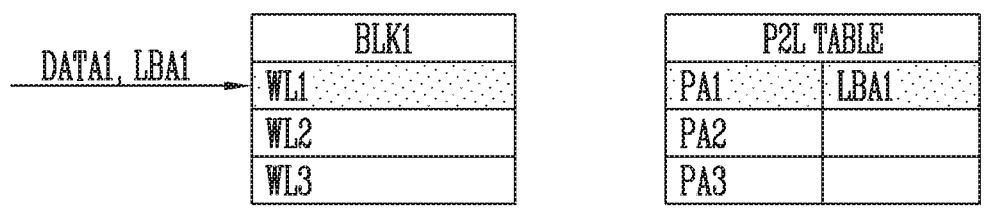
FIG. 7 is a diagram illustrating an operation of updating a physical-to-logical mapping information storage in accordance with an embodiment of the present disclosure.

FIG. 7 is a diagram illustrating an operation of updating a physical-to-logical mapping information storage in accordance with an embodiment of the present disclosure, for example, the physical-to-logical (P2L) mapping information storage 230 of FIG. 6.

Referring to FIG. 7, the physical-to-logical mapping information storage 230 may be implemented with a physical-to-logical (P2L) table.

The physical-to-logical table may include physical-to-logical mapping information indicating a mapping relationship between physical addresses of a memory block on which write data is to be stored among a plurality of memory blocks of a memory device and logical addresses of the write data. By way of example, the physical-to-logical table may include physical-to-logical mapping information regarding a memory block BLK1 of the memory device.

The memory block BLK1 may include first to third word lines WL1 to WL3. The physical-to-logical table may include first to third physical addresses PA1 to PA3. The first to third physical addresses PA1 to PA3 may be respectively physical addresses of the first to third word lines WL1 to WL3. The memory block BLK1 may correspond to the physical-to-logical table.

The number of word lines included in the memory block and the number of physical addresses included in the physical-to-logical table are not limited to those of this embodiment. In an embodiment, the physical-to-logical table may include only some of physical addresses of word lines included in a memory block. That is, the memory block may correspond to a plurality of physical-to-logical tables.

First write data DATA1 may be stored in first word line WL1 of the memory block BLK1. A logical block address LBA1 corresponding to the first write data DATA1 may be mapped to a first physical address PA1 that is a physical address of the first word line WL1.

The number of logical addresses mapped to one physical address is not limited to that of this embodiment. For example, a plurality of logical addresses may be mapped to one physical address. If the first to third write data DATA1 to DATA3 are stored in the first word line WL1, first to third logical block addresses LBA1 to LBA3 may be mapped to the first physical address PA1.

Figure 8:
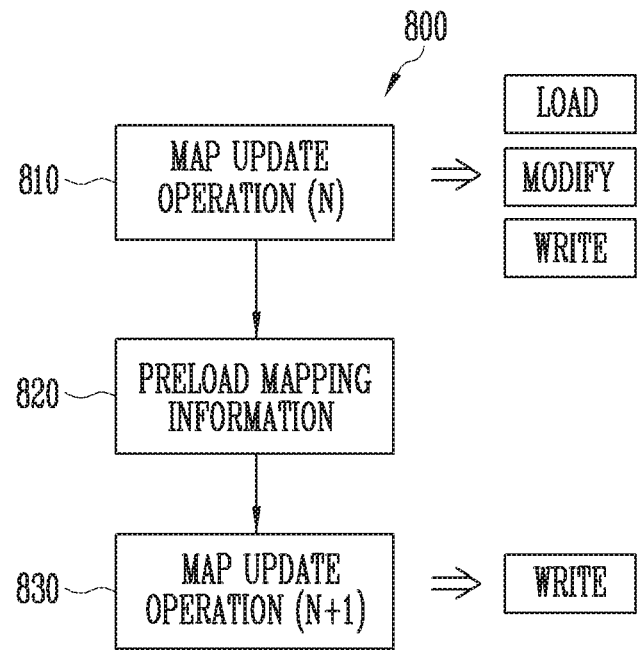
FIG. 8 is a diagram illustrating an operation of a memory controller in accordance with an embodiment of the present disclosure.

FIG. 8 is a diagram illustrating an operation 800 of a memory controller in accordance with an embodiment of the present disclosure, for example, the memory controller 200 of FIG. 6.

Referring to FIG. 8, the operation 800 may include steps 810, 820 and 830. In the following, each of the map update operations is performed for only one logical address. However, it is noted that each of the map update operations may be performed for a plurality of logical addresses corresponding to a plurality of physical addresses in a memory block.

At step 810, the memory controller 200 may perform an N-th map update operation. The N-th map update operation may include updating first mapping information among multiple mapping information stored in an area of a memory device (e.g., the memory device 100 of FIG. 6). The first mapping information may include a first logical address associated with the memory device. The N-th map update operation may be performed based on a first physical address corresponding to the first logical address.

In various embodiments, the N-th map update operation may include loading, from the memory device, the first mapping information, modifying the loaded first mapping information based on the first physical address corresponding to the first logical address, and writing the modified first mapping information in the area of the memory device.

At step 820, the memory controller 200 may preload, from the memory device, second mapping information among the multiple mapping information. Determining (or setting) of the second mapping information to be preloaded will be described with reference to FIGS. 9A to 9C.

In an embodiment, as shown in FIG. 9A, the second mapping information may be subsequent to the first mapping information.

Figure 9B:
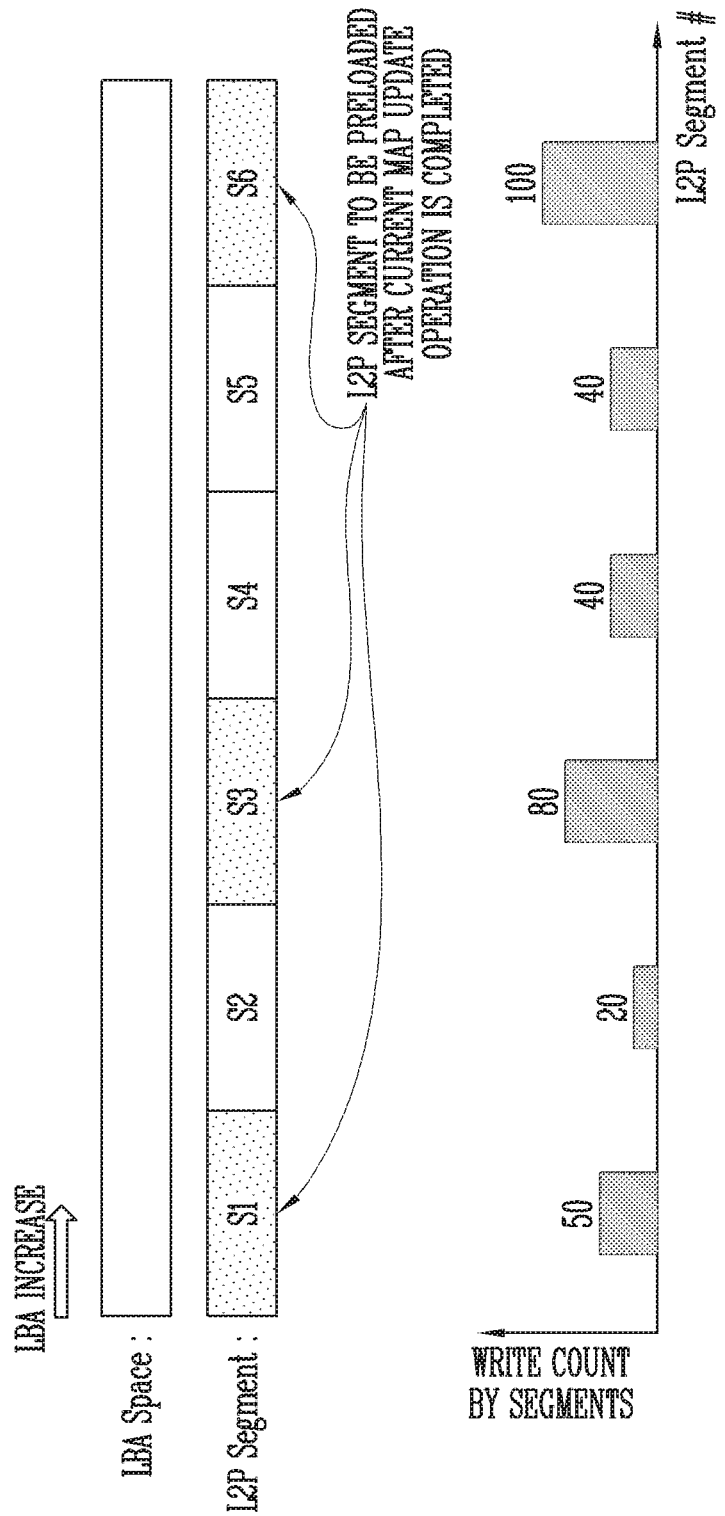
FIG. 9B is a diagram illustrating an operation of determining preload mapping information in accordance with an embodiment of the present disclosure.
Figure 9C:
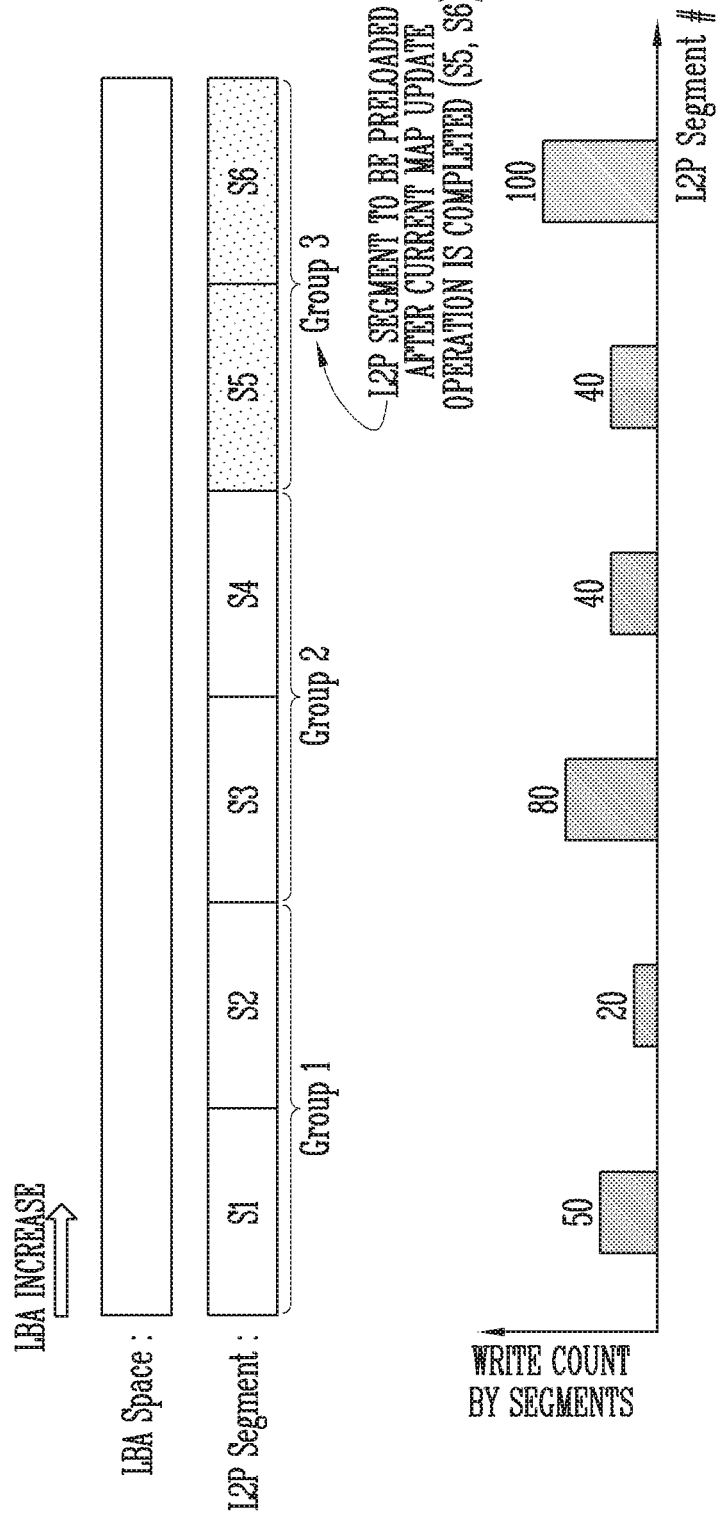
FIG. 9C is a diagram illustrating an operation of determining preload mapping information in accordance with an embodiment of the present disclosure.

In another embodiment, as shown in FIGS. 9B and 9C, the second mapping information may have a relatively high write count value among remaining mapping information of the multiple mapping information excluding the first map information. For example, the second mapping information has a highest write count value among the remaining mapping information. For another example, the second map information is one of the remaining mapping information, having a write count value greater than a threshold value.

At step 820, the memory controller 200 may modify the pre-loaded second mapping information based on a second physical address corresponding to a second logical address associated with the memory device.

At step 830, the memory controller 200 may perform an (N+1)-th map update operation. The (N+1)-th map update operation may include updating the second mapping information based on the second physical address corresponding to the second logical address.

In various embodiments, the (N+1)-th map update operation may include writing the modified second mapping information in the area of the memory device.

In various embodiments, each of the map update operations may be performed when all physical addresses of a block of the memory device are allocated. Alternatively, each of the map update operations may be performed when the block completely stores data therein.

As described above, after performing the N-th map update operation, second mapping information is preloaded and modified. Then, during the (N+1)-th map update operation, the modified second mapping information is updated. Accordingly, the speed of the (N+1)-th map update operation is improved.

FIG. 9A is a diagram illustrating an operation of determining preload mapping information in accordance with an embodiment of the present disclosure. For example, the operation of determining preload mapping information of FIG. 9A may be performed by the memory controller 200 (i.e., the map manager 210) of FIG. 6.

Referring to FIG. 9A, a logical block address (LBA) area space may include first to third logical address areas L1 to L3. A logical-to-physical (L2P) segment may include first to sixth logical-to-physical segments S1 to S6. The LBA area may be received from the host 300 of FIG. 1, and the LBA area may correspond to physical addresses of memory blocks in the memory device 100 of FIG. 1. The logical-to-physical segment of the memory device 100 may be mapping information indicating a relationship between logical addresses and physical addresses.

The first logical address area L1 may correspond to the first and second logical-to-physical segments S1 and S2. For example, the first logical address area L1 may include a plurality of logical block addresses LBA. The first and second logical-to-physical segments S1 and S2 may represent a mapping relationship between the plurality of logical block addresses LBA of the first logical address area L1, and physical addresses respectively mapped to the plurality of logical block addresses LBA.

The second logical address area L2 may correspond to the third and fourth logical-to-physical segments S3 and S4. The third logical address area L3 may correspond to the fifth and sixth logical-to-physical segments S5 and S6. The number of logical-to-physical segments corresponding to each logical address area is not limited to that of this embodiment.

The logical-to-physical mapping information stored in the memory device may include multiple mapping information, that is, a plurality of logical-to-physical segments. Preload mapping information may include at least one or more logical-to-physical segments included in the logical-to-physical mapping information. Each of the logical-to-physical segments may include at least one logical address.

After a current map update operation has been completed, preload mapping information may be preloaded before a subsequent map update operation is performed. The preload mapping information may include at least one or more logical-to-physical segments to be preloaded. The preload mapping information may include a logical-to-physical segment that is expected for a sequential write operation to be performed thereon. In various embodiments, the preload mapping information may include a logical-to-physical segment which is sequential to a logical-to-physical segment on which the current map update operation is performed. Logical addresses on which the sequential write operation is performed may be sequential logical addresses.

Logical addresses that are included in the second logical address area L2 and the third logical address area L3 may be sequential logical addresses due to the sequential write operation. The third and fourth logical-to-physical segments S3 and S4 may correspond to the second logical address area L2, and the fifth and sixth logical-to-physical segments S5 and S6 may correspond to the third logical address area L3.

Therefore, the third and fourth logical-to-physical segments S3 and S4 and the fifth and sixth logical-to-physical segments S5 and S6 may be sequential logical-to-physical segments.

Hence, the preload mapping information may include the fifth and sixth logical-to-physical segments S5 and S6 that are sequential to the third and fourth logical-to-physical segments S3 and S4 on which the current map update operation is performed.

In an embodiment, each of the at least one or more logical-to-physical segments may include at least one logical address that is sequential to the logical addresses on which the sequential write operation has been performed. For instance, logical addresses that are sequential to the logical addresses included in the second logical address area L2 may be logical addresses included in the third logical address area L3. The fifth and sixth logical-to-physical segments S5 and S6 may include at least one logical address among the logical addresses included in the third logical address area L3.

FIG. 9B is a diagram illustrating an operation of determining preload mapping information in accordance with an embodiment of the present disclosure. For example, the operation of determining preload mapping information of FIG. 9B may be performed by the memory controller 200 (i.e., the map manager 210) of FIG. 6.

Referring to FIG. 9B, preload mapping information may include a logical-to-physical segment expected for a random write operation to be performed thereon. Logical-to-physical segments on which the random write operation is to be performed may not be sequential to each other.

In various embodiments, the preload mapping information may include at least one logical-to-physical segment selected from the logical-to-physical mapping information. The selected logical-to-physical segment may be determined in descending order of write count. The write count may be the total number of times the write operation has been performed on the corresponding logical-to-physical segment. Write count may be calculated for each of logical addresses in the corresponding logical-to-physical segment, and write count of the corresponding logical-to-physical segment may be determined.

For example, the write count of the first logical-to-physical segment S1 may be 50. The write count of the second logical-to-physical segment S2 may be 20. The write count of the third logical-to-physical segment S3 may be 80. The write count of the fourth logical-to-physical segment S4 may be 40. The write count of the fifth logical-to-physical segment S5 may be 40. The write count of the sixth logical-to-physical segment S6 may be 100. The sixth logical-to-physical segment S6 has the highest write count, the third logical-to-physical segment S3 has the second highest write count, and the first logical-to-physical segment S1 has the third highest write count. The second logical-to-physical segment S2 has the lowest write count.

For example, the sixth logical-to-physical segment S6, the third logical-to-physical segment S3, and the first logical-to-physical segment S1 may be selected as the preload mapping information. The number of selected logical-to-physical segments is not limited to that of this embodiment.

In an embodiment, the preload mapping information may include logical-to-physical segments having a write count greater than a threshold value.

For example, the threshold value may be 50. Therefore, the sixth logical-to-physical segment S6, the third logical-to-physical segment S3, and the first logical-to-physical segment S1 may be selected as the preload mapping information.

FIG. 9C is a diagram illustrating an operation of determining preload mapping information in accordance with an embodiment of the present disclosure. For example, the operation of determining preload mapping information of FIG. 9C may be performed by the memory controller 200 (i.e., the map manager 210) of FIG. 6.

Referring to FIG. 9C, write count may be calculated in segment groups.

A plurality of logical-to-physical segments in the logical-to-physical mapping information may be divided into a plurality of segment groups. The preload mapping information may include at least one segment group among the plurality of segment groups.

For example, the first to sixth logical-to-physical segments S1 to S6 may be divided into first to third segment groups Group 1 to Group 3. The first segment group Group 1 may include the first and second logical-to-physical segments S1 and S2. The second segment group Group 2 may include the third and fourth logical-to-physical segments S3 and S4. The third segment group Group 3 may include the fifth and sixth logical-to-physical segments S5 and S6. The number of logical-to-physical segments included in each segment group is not limited to that of this embodiment.

In various embodiments, at least one segment group may be selected as the preload mapping information. Each of the plurality of segment groups may have a write count. The write count may be the total number of times the write operation has been performed on the segment group. The write count may be calculated by the number of logical addresses on which data has been written.

For example, the write count of the first segment group Group 1 may be the sum of the respective write counts of the first and second logical-to-physical segments S1 and S2. The write count of the first segment group Group 1 may be 70 (=50+20). The write count of the second segment group Group 2 may be 120 (=80+40). The write count of the third segment group Group 3 may be 140 (=40+100).

In various embodiments, the third segment group Group 3 may be selected having the highest write count, as at least one segment group to be included in the preload mapping information. The number of selected segment groups is not limited to that of this embodiment. Consequently, the preload mapping information may include the fifth and sixth logical-to-physical segments S5 and S6 that belong to the third segment group Group 3.

In an embodiment, the preload mapping information may include at least one segment group having a write count greater than a threshold value.

For example, the threshold value may be 130. Therefore, the third segment group Group 3 may be selected as the preload mapping information.

FIG. 10 is a diagram illustrating a map update operation in accordance with an embodiment of the present disclosure. For example, the map update operation of FIG. 10 may be performed by the memory controller 200 (i.e., the map manager 210) of FIG. 6.

Referring to FIG. 10, in response to a first write request from a host (e.g., the host 300 of FIG. 1), first write data may be stored in physical addresses of a memory device (e.g., the memory device 100 of FIGS. 1 and 6), corresponding to a first logical address area L1. In response to a second write request of the host, second write data may be stored in physical addresses of the memory device, corresponding to a second logical address area L2. Logical addresses in the first logical address area L1 may be included in the third logical-to-physical segment S3. Logical addresses in the second logical address area L2 may be included in the fifth logical-to-physical segment S5.

The preload mapping information storage 220 of FIG. 6 may store preload mapping information that is expected to be updated before the map update operation is performed, under control of the map manager 210. For example, the preload mapping information may include the fifth and sixth logical-to-physical segments S5 and S6 as shown in FIGS. 9A and 9B.

The physical-to-logical mapping information storage 230 may store physical-to-logical mapping information.

The map update buffer 240 may store logical-to-physical mapping information to be updated during the map update operation. The logical-to-physical mapping information to be updated may be logical-to-physical mapping information to be modified according to the physical-to-logical mapping information stored in the physical-to-logical mapping information storage 230.

Logical addresses corresponding to the write data may be used to modify the preload mapping information or used to generate the physical-to-logical mapping information. In an embodiment, if the logical addresses corresponding to the write data are used to modify the preload mapping information, then the logical addresses may not be used to generate the physical-to-logical mapping information.

The first logical address area L1 corresponding to the first write request may not correspond to the fifth logical-to-physical segment S5. Therefore, the first logical address area L1 may not be used to modify the fifth logical-to-physical segment S5 of the preload mapping information. The first logical address area L1 may be used to generate the physical-to-logical mapping information.

The second logical address area L2 corresponding to the second write request may correspond to the fifth logical-to-physical segment S5. Therefore, the second logical address area L2 may be used to modify the fifth logical-to-physical segment S5 of the preload mapping information. In an embodiment, the second logical address area L2 may be used to generate the physical-to-logical mapping information. In another embodiment, physical-to-logical mapping information corresponding to the second logical address area L2 may not be generated.

In an embodiment, the modified fifth logical-to-physical segment S5 in the preload mapping information may be used to update the logical-to-physical mapping information stored in the memory device 100 during the map update operation. The unmodified sixth logical-to-physical segment S6 in the preload mapping information may not be used to update the logical-to-physical mapping information stored in the memory device during the map update operation.

In an embodiment, the physical-to-logical mapping information may be used to modify the logical-to-physical mapping information that is stored in the map update buffer 240. For example, the physical-to-logical mapping information generated using the first logical address area L1 may be used to modify the logical-to-physical mapping information.

Furthermore, logical-to-physical mapping information that has already been updated through the preload mapping information may not be modified using the physical-to-logical mapping information. For example, the physical-to-logical mapping information generated using the second logical address area L2 may not be used to modify the logical-to-physical mapping information. The reason for this is because the logical-to-physical mapping information corresponding to the second logical address area L2 has been already modified in the preload mapping information.

The logical-to-physical mapping information stored in the map update buffer 240 may be modified based on the physical-to-logical mapping information stored in the physical-to-logical mapping information storage 230. The modified logical-to-physical information may be used to update the logical-to-physical mapping information stored in the memory device 100 during the map update operation.

Figure 11C:
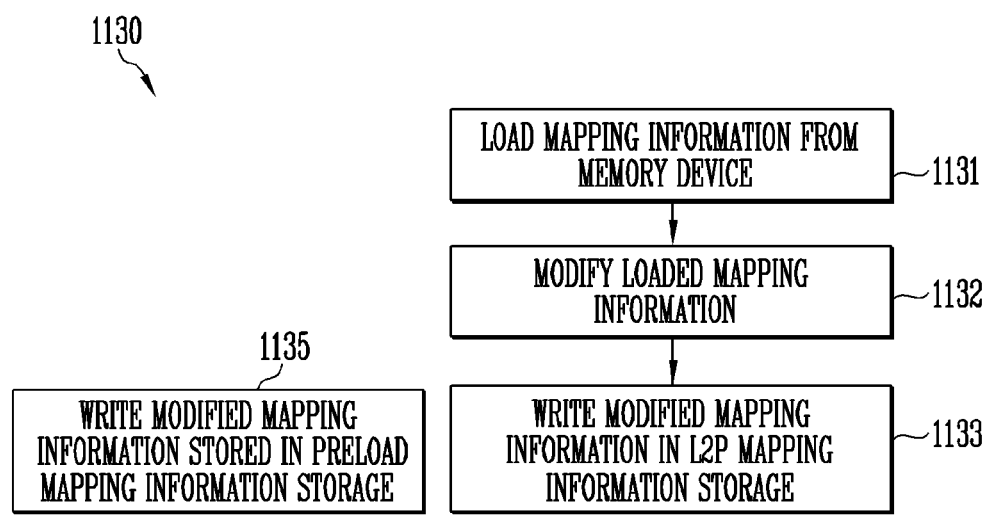

FIGS. 11A to 11C are flowcharts illustrating operations of a memory controller in accordance with an embodiment of the present disclosure. For example, the operations of FIGS. 11A to 11C may be performed by the memory controller 200 (i.e., the map manager 210) of FIG. 6.

FIG. 11A illustrates an operation 1110 including determining preload mapping information and preloading the determined mapping information.

Referring to FIG. 11A, the operation 1110 may include steps 1112 and 1114. The operation 1110 may be performed after a map update operation and before a next map update operation as shown in FIGS. 8 and 9A. At step 1112, the memory controller 200 may determine preload mapping information among the logical-to-physical mapping information stored in the memory device 100.

At step 1114, the memory controller 200 may obtain the preload mapping information from the memory device 100. That is, the memory controller 200 may preload the determined mapping information from the memory device 100.

FIG. 11B illustrates an operation 1120 including modifying preload mapping information. By way of example, the operation 1120 may be performed in response to a write request received from a host (e.g., the host 300 of FIG. 1). It is noted that the operation 1120 may be similarly performed in response to other requests such as a read request or an unmap request.

Referring to FIG. 11B, the operation 1120 may include steps 1121 to 1125. At step 1121, the memory controller 200 may receive write data and a logical address corresponding to the write data from the host 300. At step 1122, the memory controller 200 may search the preload mapping information storage 220 of FIG. 6. At step 1123, the memory controller 200 may determine whether the logical address is included in the preload mapping information storage 220. That is, the memory controller 200 may determine whether mapping information corresponding to the logical address is preloaded.

When it is determined that the mapping information corresponding to the logical address is preloaded (1123, YES), at step 1124, the memory controller 200 may modify the preloaded mapping information based on the logical address. Further, the memory controller 200 may modify meta data such as valid page count.

When it is determined that the mapping information corresponding to the logical address is not preloaded (1123, NO), at step 1125, the memory controller 200 may store the logical address in the physical-to-logical (P2L) mapping information storage 230.

FIG. 11C illustrates an operation 1130 including updating mapping information. The operation 1130 may be performed when all physical addresses of a block of the memory device 100 are allocated. Alternatively, the operation 1130 may be performed when the block completely stores data therein.

Referring to FIG. 11C, the operation 1130 may include steps 1131 to 1133 and 1135. Step 1135 may be performed for modified mapping information stored in the preload mapping information storage 220 of FIG. 6. Steps 1131 to 1133 may be performed for logical addresses stored in the logical-to-physical mapping information storage 230, which do not correspond to the modified mapping information in the preload mapping information storage 220.

At step 1131, the memory controller 200 may load mapping information corresponding to logical addresses in response to requests from the host 300, from the logical-to-physical (L2P) mapping information storage 111 of the memory device 100. At step 1132, the memory controller 200 may modify the loaded mapping information based on physical addresses corresponding to the logical addresses. At step 1133, the memory controller 200 may transmit the modified mapping information to the memory device 100 such that the modified mapping information is written in the L2P mapping information storage 111 of the memory device 100.

At step 1135, the memory controller 200 may update the modified preload mapping information based on logical address corresponding to write data. That is, the memory controller 200 may transmit the modified preload mapping information stored in the preload mapping information storage 220 to the memory device 100, such that the modified preload mapping information is written in the logical-to-physical mapping information storage 111 of the memory device 100.

Figure 12:
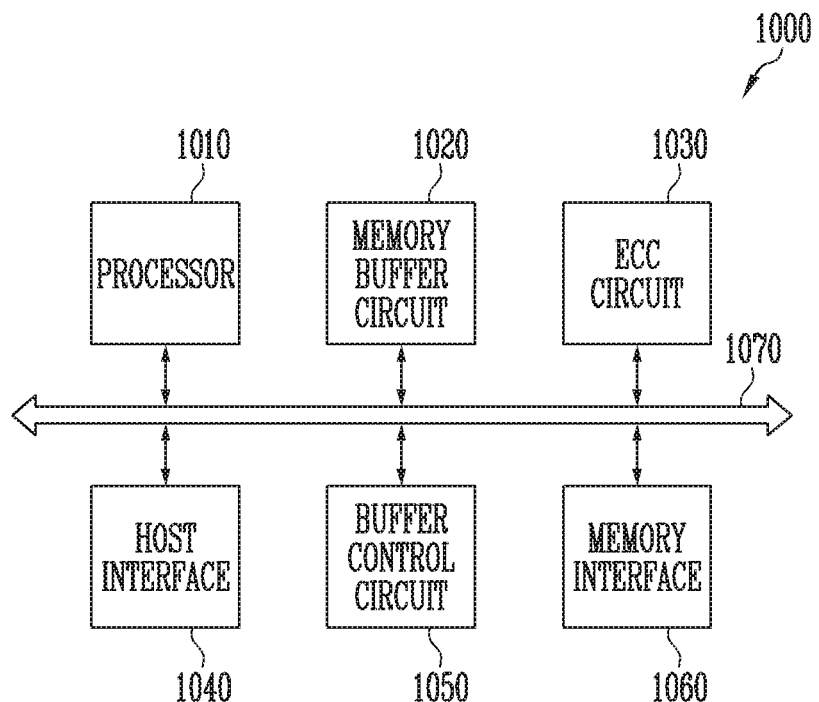
FIG. 12 is a diagram illustrating a memory controller in accordance with an embodiment of the present disclosure.

FIG. 12 is a diagram illustrating a memory controller 1000 in accordance with an embodiment of the present disclosure. The memory controller 1000 may include components as shown herein, and may additionally include components of the memory controller 200 as shown in FIGS. 1 and 6.

Referring to FIG. 12, the memory controller 1000 is coupled to a host (e.g., the host 300 of FIG. 1) and a memory device (e.g., the memory device 100 of FIG. 1). In response to a request from the host, the memory controller 1000 may access the memory device. For example, the memory controller 1000 may control a write operation, a read operation, an erase operation, and a background operation of the memory device. The memory controller 1000 may provide an interface between the memory device and the host. The memory controller 1000 may drive firmware for controlling the memory device.

The memory controller 1000 may include a processor 1010, a memory buffer circuit 1020, an error correction code (ECC) circuit 1030, a host interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the host through the host interface 1040, and communicate with the memory device through the memory interface 1060. In addition, the processor 1010 may communicate with the memory buffer circuit 1020 through the buffer control circuit 1050. The processor 1010 may control the operation of the memory device using the memory buffer circuit 1020 as an operating memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA into the PBA using a mapping table. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device as data to be stored, and may be programmed to a memory cell array of the memory device.

During a read operation, the processor 1010 may derandomize data received from the memory device 100. For example, the processor 1010 may use a derandomizing seed to derandomize data received from the memory device. Derandomized data may be output to the host.

In an embodiment, the processor 1010 may drive software or firmware to perform the randomizing operation or the derandomizing operation.

The memory buffer circuit 1020 may be used as an operating memory, a cache memory, or a buffer memory of the processor 1010. The memory buffer circuit 1020 may store codes and commands to be executed by the processor 1010. The memory buffer circuit 1020 may store data to be processed by the processor 1010. The memory buffer circuit 1020 may include a static random access memory (RAM) (SRAM) or a dynamic RAM (DRAM).

The ECC circuit 1030 may perform error correction. The ECC circuit 1030 may perform an ECC encoding operation based on data to be written to the memory device through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in the memory interface 1060 as a component of the memory interface 1060.

The host interface 1040 may communicate with the host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multimedia card (MMC), an embedded MMC (eMMC), a dual in-line memory module (DIMM), a registered DIMM (RDIMM), and a load reduced DIMM (LRDIMM) communication methods.

The buffer control circuit 1050 may control the memory buffer circuit 1020 under control of the processor 1010.

The memory interface 1060 may communicate with the memory device under control of the processor 1010. The memory interface 1060 may communicate a command, an address, and data with the memory device through the channel.

For example, the memory controller 1000 may include neither the memory buffer circuit 1020 nor the buffer control circuit 1050.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer circuit 1020, and the memory interface 1060.

Figure 13:
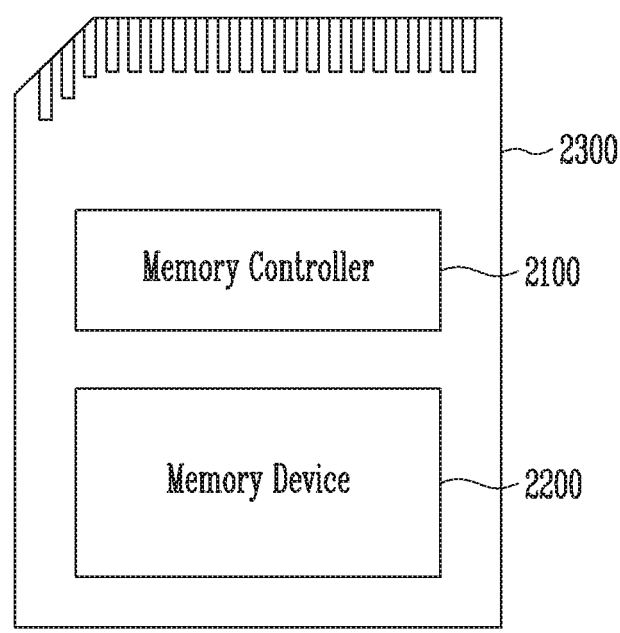
FIG. 13 is a block diagram illustrating a memory card system to which the storage device in accordance with an embodiment of the present disclosure is applied.

FIG. 13 is a block diagram illustrating a memory card system 2000 to which the storage device in accordance with an embodiment of the present disclosure is applied.

Referring FIG. 13, the memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2100 and the host. The memory controller 2100 may drive firmware for controlling the memory device 2200. The memory controller 2100 may be embodied in the same manner as that of the memory controller 200 described with reference to FIGS. 1 and 6.

In an embodiment, the memory controller 2100 may include components such as a random access memory (RAM), a processing unit, a host interface, and a memory interface, and an error correction code (ECC) circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer system interface (SCSI), enhanced small disk interface (ESDI), integrated drive electronics (IDE), Fire e, universal flash storage (UFS), wireless fidelity (Wi-Fi), Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM).

In an embodiment, the memory controller 2100 and the memory device 2200 may be integrated into a single semiconductor device to form a memory card. For example, the memory controller 2100 and the memory device 2200 may be integrated into a single semiconductor device to form a memory card such as a personal computer memory card international association (PCMCIA), a compact flash (CF) card, a smart media card (e.g., SM or SMC), a memory stick, a multimedia card (e.g., MMC, RS-MMC, or MMCmicro), a secure digital (SD) card (e.g., SD, miniSD, microSD, or SDHC), or a universal flash storage (UFS).

Figure 14:
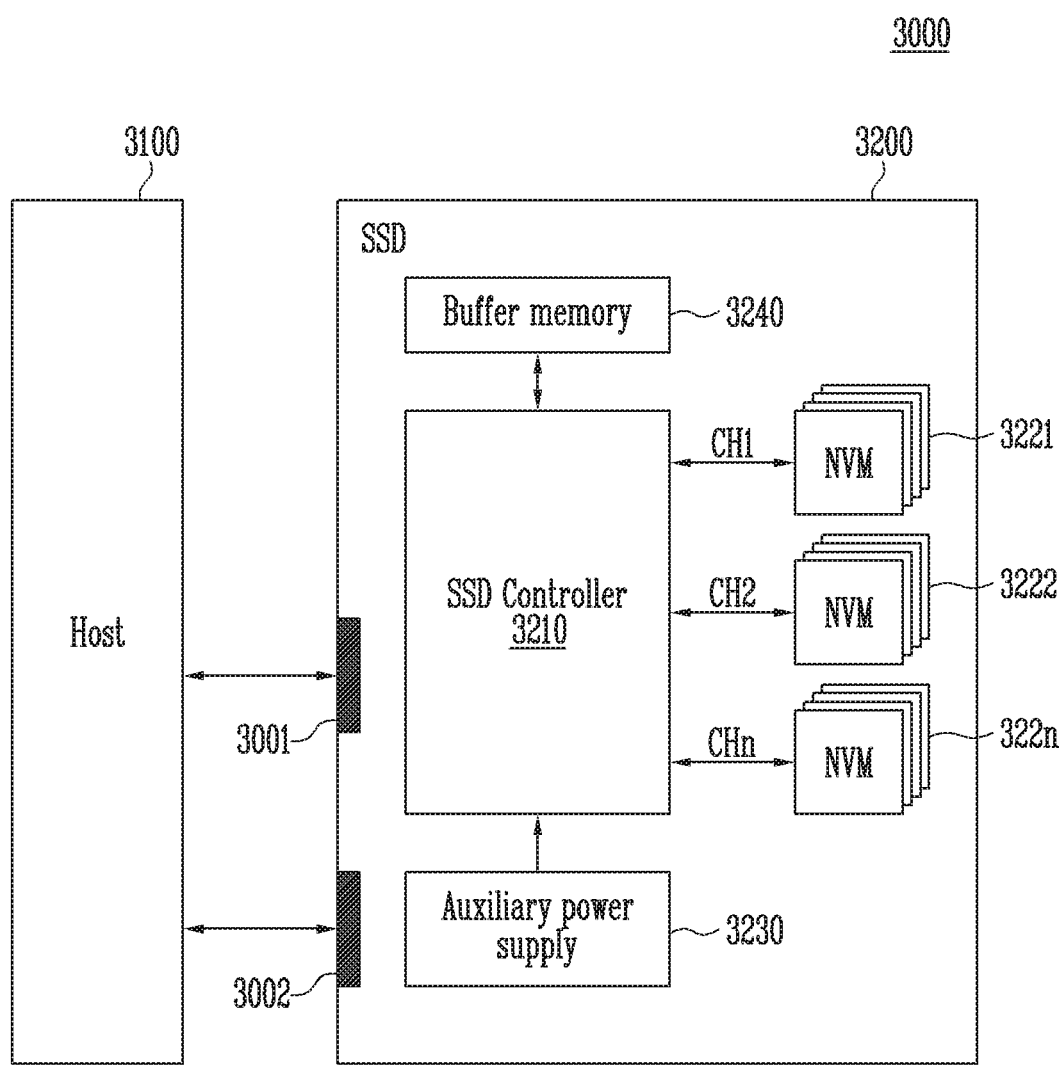
FIG. 14 is a block diagram illustrating a solid state drive (SSD) system to which the storage device in accordance with an embodiment of the present disclosure is applied.

FIG. 14 is a block diagram illustrating a solid state drive (SSD) system 3000 to which the storage device in accordance with an embodiment of the present disclosure is applied.

Referring to FIG. 14, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIGS. 1 and 6.

The SSD controller 3210 may control the plurality of flash memories 3221 to 322n in response to the signals SIG received from the host 3100. In an embodiment, the signals SIG may be signals based on an interface between the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), wireless fidelity (Wi-Fi), Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly provided. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322n. The buffer memory 3240 may include volatile memories such as a dynamic random access memory (DRAM), a synchronous DRAM (SDRAM), a double data rate (DDR) SDRAM, a low power double data rate (LPDDR) SDRAM, and a graphics RAM (GRAM) or nonvolatile memories such as a ferroelectric RAM (FRAM), a resistive RAM (ReRAM), a spin-transfer torque magnetic RAM (STT-MRAM), and a phase-change RAM (PRAM).

Figure 15:
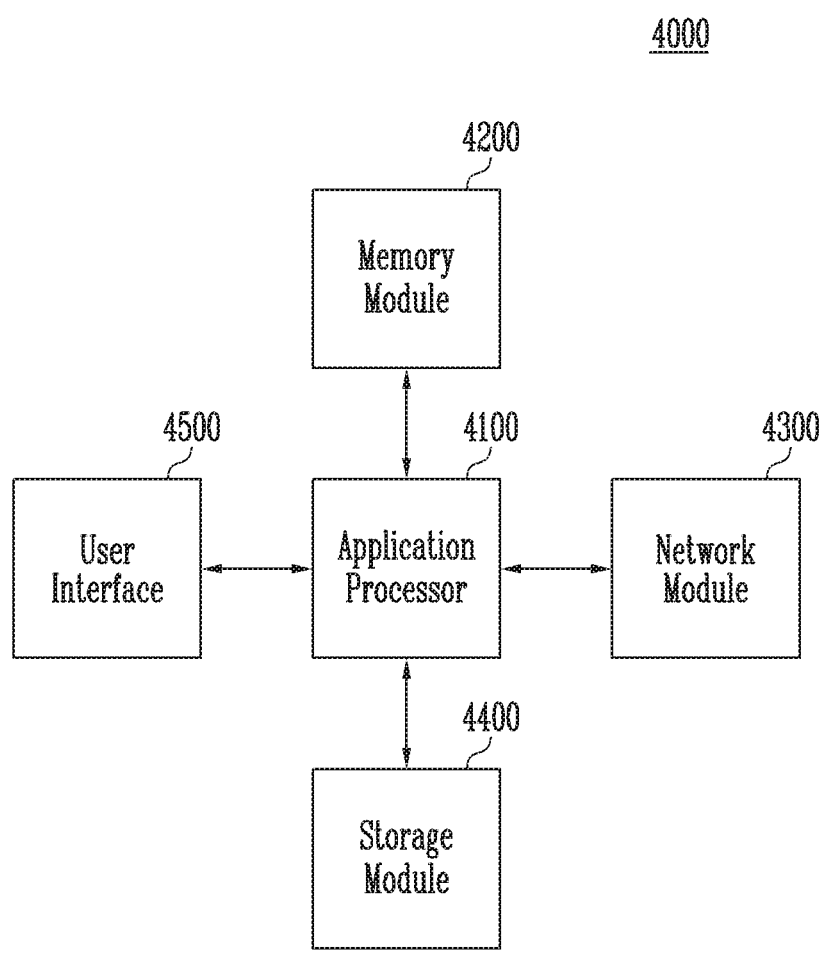
FIG. 15 is a block diagram illustrating a user system to which the storage device in accordance with an embodiment of the present disclosure is applied.

FIG. 15 is a block diagram illustrating a user system 4000 to which the storage device in accordance with an embodiment of the present disclosure is applied.

Referring to FIG. 15, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, and graphic engines for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile random access memory (RAM) such as a dynamic RAM (DRAM), a synchronous DRAM (SDRAM), a double data rate (DDR) SDRAM, a DDR2 SDRAM, a DDR3 SDRAM, a low power DDR (LPDDR) SDRAM, and an LPDDR3 SDRAM, or a nonvolatile RAM such as a phase-change RAM (PRAM), a resistive RAM (ReRAM), a magnetic RAM (MRAM), and a ferroelectric RAM (FRAM). In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), Worldwide Interoperability for Microwave Access (WiMAX), wireless local area network (WLAN), ultra-wideband (UWB), Bluetooth, or wireless fidelity (Wi-Fi) communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be operated in the same manner as that of the memory device 100 described above with reference to FIGS. 1 and 6. The storage module 4400 may be operated in the same manner as that of the storage device 50 described above with reference to FIGS. 1 and 6.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a liquid crystal display (LCD), an organic light emitting diode (OLED) display device, an active matrix OLED (AMOLED) display device, an LED, a speaker, and a monitor.

Various embodiments of the present disclosure may provide a storage device having an enhanced map update speed, and a method of operating the storage device.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not be always performed in regular order. Furthermore, the embodiments disclosed in the present specification and the drawings aims to help those with ordinary knowledge in this art more clearly understand the present disclosure rather than aiming to limit the bounds of the present disclosure. That is, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A data storage device comprising:
a memory controller having a map manager and preload mapping information storage; and
a memory device having logical-to-physical mapping information,
wherein the memory controller is configured to, in response to a current map update operation, determine and obtain from the memory device, preload mapping information, and then store the preload mapping information in the preload mapping information storage, before a subsequent map update operation of the logical-to-physical mapping information is performed, and
wherein the preload mapping information includes logical-to-physical mapping information to be updated.

2. The data storage device of claim 1, wherein the map manager updates, when write data and a logical address of the write data are received from a host, logical-to-physical mapping information corresponding to the logical address of the write data among the preload mapping information based on a physical address in which the write data is to be stored.

3. The data storage device of claim 2,
wherein the logical-to-physical mapping information stored in the memory device includes a plurality of logical-to-physical segments,
wherein the preload mapping information includes at least one or more logical-to-physical segments of the plurality of logical-to-physical segments, and
wherein the map manager updates a logical-to-physical segment that includes the logical address of the write data.

4. The data storage device of claim 2, wherein the map manager updates the logical-to-physical mapping information corresponding to the logical address of the write data among the preload mapping information while a program operation of storing the write data in the memory device is performed.

5. The data storage device of claim 2, further comprising a physical-to-logical mapping information storage configured to store physical-to-logical mapping information that is a mapping relationship between a physical address of a memory block in which the write data is to be stored and the logical address of the write data.

6. The data storage device of claim 5, wherein the map manager performs the subsequent update operation when all physical addresses corresponding to the memory block are allocated.

7. The data storage device of claim 5, wherein the map manager performs the subsequent map update operation when the memory block is a write complete block to which data has been fully written.

8. The data storage device of claim 7, further comprising a map update buffer configured to store mapping information to be updated among the logical-to-physical mapping information stored in the memory device.

9. The data storage device of claim 8, wherein the map manager updates, based on the physical-to-logical mapping information, logical-to-physical mapping information different from the preload mapping information.

10. The data storage device of claim 1,
wherein the logical-to-physical mapping information stored in the memory device includes a plurality of logical-to-physical segments, and
wherein the preload mapping information includes at least one or more logical-to-physical segments of the plurality of logical-to-physical segments.

11. The data storage device of claim 10, wherein the at least one or more logical-to-physical segments include a logical-to-physical segment including logical addresses sequential to a logical address of data previously stored in response to a write request of sequential data received from a host.

12. The data storage device of claim 10, wherein the at least one or more logical-to-physical segments include a logical-to-physical segment sequential to a logical-to-physical segment on which, before the map update operation, a map update operation has been performed.

13. The data storage device of claim 10,
wherein the at least one or more logical-to-physical segments include logical-to-physical segments selected in sequence from highest to lowest in write count among the plurality of logical-to-physical segments, and
wherein the write count is the number of logical addresses on which data has been written in each of the plurality of logical-to-physical segments.

14. The data storage device of claim 1,
wherein the logical-to-physical mapping information stored in the memory device includes a plurality of segment groups each including at least one logical-to-physical segment,
wherein the preload mapping information includes at least one segment group selected in sequence from highest to lowest in write count among the plurality of segment groups, and
wherein the write count is the number of logical addresses on which data has been written in each of the plurality of segment groups.

15. The data storage device of claim 1, wherein the map manager unmaps logical addresses included in at least one logical-to-physical segment included in the preload mapping information.

16. A storage device comprising:
a memory device configured to store a plurality of logical-to-physical segments including mapping information between a logical address of data provided from a host and a physical address in which the data is stored; and
a memory controller configured to, in response to a current map update operation, determine, before a subsequent map update operation of updating the plurality of logical-to-physical segments is performed, at least one or more logical-to-physical segments to be updated, obtain the at least one or more logical-to-physical segments from the memory device, and store the at least one or more logical-to-physical segments in a preload mapping information storage.

17. The storage device according to claim 16, wherein the memory controller updates, when write data and a logical address of the write data are received from the host, a logical-to-physical segment in the preload-mapping information storage.

18. The storage device according to claim 17, wherein the memory controller updates the logical-to-physical segment in the preload mapping information storage while a program operation of storing the write data in the memory device is performed.

19. The storage device according to claim 16, wherein the at least one or more logical-to-physical segments include a logical-to-physical segment having logical addresses sequential to a logical address of data previously stored in response to a write request of sequential data received from the host.

20. The storage device according to claim 16, wherein the at least one or more logical-to-physical segments include logical-to-physical segments selected in sequence from highest to lowest in write count among the plurality of logical-to-physical segments, and
    wherein the write count is the number of logical addresses on which data has been written in each of the plurality of logical-to-physical segments.

\* \* \* \* \*